United States Patent
Owen

(10) Patent No.: US 12,072,361 B2
(45) Date of Patent: Aug. 27, 2024

(54) METHODS, DEVICES, AND SYSTEMS FOR COHERENT TIME-GATED RESIDUAL SPUR CHARACTERIZATION AND CORRECTION IN SIGNAL ANALYZERS

(71) Applicant: Keysight Technologies, Inc., Santa Rosa, CA (US)

(72) Inventor: Andrew Michael Owen, Lake Villa, IL (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 710 days.

(21) Appl. No.: 17/197,182

(22) Filed: Mar. 10, 2021

(65) Prior Publication Data
US 2022/0291263 A1    Sep. 15, 2022

(51) Int. Cl.
G01R 23/16     (2006.01)
G01R 23/165    (2006.01)
H04B 1/10      (2006.01)
G06F 3/02      (2006.01)

(52) U.S. Cl.
CPC ......... *G01R 23/165* (2013.01); *H04B 1/1027* (2013.01); *G06F 3/02* (2013.01)

(58) Field of Classification Search
CPC ........ G01R 23/165; H04B 1/1027; G06F 3/02
USPC ....................................................... 702/193
See application file for complete search history.

(56) References Cited

U.S. PATENT DOCUMENTS

| | | | |
|---|---|---|---|
| 7,292,947 B1 * | 11/2007 | Tabatabaei | G01R 29/26 |
| | | | 702/191 |
| 7,558,991 B2 * | 7/2009 | Mattes | H04L 1/205 |
| | | | 702/69 |
| 7,646,704 B2 | 1/2010 | Yu et al. | |
| 7,924,904 B2 | 4/2011 | Gaikwad et al. | |

(Continued)

FOREIGN PATENT DOCUMENTS

WO    2019219266 A1    11/2019

OTHER PUBLICATIONS

"Confirming Spurious," Keysight Technologies, http://ena.support.keysight.com/e5052b/manuals/webhelp/eng/?hid =-35185.631410.00&cc-US&lc-eng&id=1166597, pp. 1-4 (Accessed Feb. 18, 2021).

(Continued)

*Primary Examiner* — Aditya S Bhat

(57) ABSTRACT

Methods, devices, and systems for coherent time-gated residual spur characterization and correction in signal analyzers. In some cases, the method includes: displaying a signal on the display of the signal analyzer that is present without an input signal being provided to an input of the signal analyzer; establishing a predetermined amplitude threshold above which energy spikes in the signal being displayed on the display of the signal analyzer are considered spurious; automatically identifying one or more spurious energy spikes in the signal being displayed on the display of the signal analyzer based on the predetermined amplitude threshold; and automatically reducing or removing the one or more spurious energy spikes from the signal being displayed on the display of the signal analyzer. The method can be performed using one or more processors, application specific integrated circuits (ASICs), field-programmable gate array (FPGA), or other circuitry on any suitable signal analyzer.

20 Claims, 17 Drawing Sheets

(56) References Cited

U.S. PATENT DOCUMENTS

| | | |
|---|---|---|
| 9,172,476 B2 | 10/2015 | Nguyen et al. |
| 2006/0281425 A1 | 12/2006 | Jungerman |
| 2021/0350237 A1* | 11/2021 | Litichever ................ G06N 3/08 |

OTHER PUBLICATIONS

"R&S FSWP-K50 Spurious Measurement User Manual," Rohde & Schwarz, Version 02, pp. 1-192 (2019).

* cited by examiner

METHODS, DEVICES, AND SYSTEMS FOR COHERENT TIME-GATED RESIDUAL SPUR CHARACTERIZATION AND CORRECTION IN SIGNAL ANALYZERS

TECHNICAL FIELD

The subject matter disclosed herein relates generally to signal analyzers. More particularly, the subject matter disclosed herein relates to characterizing and correcting residual signal spurs in signal analyzers.

BACKGROUND

Signal analyzers are instruments used to measure the magnitude and phase of an electrical input signal received by the analyzer. The analyzers employ digital techniques to extract useful information that is carried by the electrical input signal. In many analyzers, the spectrum charts display residual spurs (i.e., spurious energy spikes or peaks in the spectrum chart that are not attributed to the actual input signal) that can impede effective analysis of the signal. Residual spurs are present on the spectrum chart regardless if an input signal is provided and regardless of the characteristics of the input signal. Additionally, the frequency and amplitude of the residual spurs are independent of the frequency and amplitude of the input signal.

To help better visualize these phenomena, FIG. 1A and FIG. 1B illustrate spectrum charts with input related spurs highlighted and FIG. 2A and FIG. 2B illustrate spectrum charts with residual spurs highlighted. FIG. 1A illustrates a spectrum with an input signal at one frequency (large spike) and FIG. 1B shows the spectrum with input signal at a different frequency than in FIG. 1A. The spur's presence is dependent on the input signals' frequency (and, although not shown, input signal amplitude). FIG. 1A does not have a signal input connected and FIG. 1B does. As highlighted by the oval, a spur is present with FIG. 1B, but not with FIG. 1A. Therefore, this is considered an input-related spur because the spur is only present when the particular signal is present.

FIG. 2A and FIG. 2B illustrate very similar spectrums as FIG. 1A and FIG. 1B. In this case, the spurs are present in both charts (i.e., both when the input signal is present and when it is not), as highlighted by the oval. This is so because residual spurs are present regardless of the input signal and their frequency and amplitude are independent of the input signal. The residual spur that is circled by the oval does NOT change, it is present at the same amplitude, frequency, and phase regardless of the input's frequency or presence.

Some causes of the residual spurs include local oscillator (LO) leakages, a "DC offset" in the homodyne receiver, harmonics of the local oscillator mixing with one another, analog to digital converter (ADC) interleave spurs, and crosstalk or interference where there is insufficient shielding.

Currently, in order to address the issue of residual spurs intermediate frequency (IF) dithering can be used to help reduce the spurs. In this case, "real" signals at the final intermediate frequency will shift (+/−) 1:1 with respect to the LO frequency depending on high- or low-side mixing. Digital IF can shift accordingly. Other mixing modes may be desired at higher frequencies (i.e., 2:1 or 3:1), but the ratio is known a priori. In this case, the residual spurs will either shift in the other direction (−/+) 1:1 or at a different proportion (e.g., 3:1). If two (or more) acquisitions are made at different intermediate frequencies, the minimum of the set at each fast Fourier transform (FFT) bin can be taken and only "real" frequencies should remain constant and therefore preserved after the "min" operator is executed. However, some problems with this technique are that it only works on spectrum magnitude data, there is no phase data (i.e., there is no IQ time series), and this technique requires the signal to be quasi-stationary between each acquisition. In the present application, when referring to the acronym IQ, such as in the term "IQ data" the "I" refers to "in-phase data," which is the "real part" of a complex electrical signal comprising real and imaginary parts, and "Q" refers to "quadrature," which is the "imaginary part" of the complex electrical signal. The quadrature signal is 90 degrees out of phase with the in-phase signal.

Additionally, current solutions to the residual spurs issue include real-time LO dithering or chirped LO. In this technique, throughout a single, continuous IQ acquisition, the first "physical" LO's phase is dithered continuously, which phase modulates the input signal in a unique way. In this method, the continuous dithering could be performed with a pseudorandom phase, sinusoidal, or linear "chirped" LO (quadratic phase trajectory). In this technique, the phase trajectory of the spurs undergo different phase trajectories due to different frequency relationships relative to the LO frequency. Once in the digital domain, the technique applies the opposite phase dithering to reconstruct the original signal. Here, the "un-dithering" will not reconstruct the spurs at their original frequencies, but rather leave the energy spread over some bandwidth related to the dither strength.

The real-time LO dithering technique is applied to the IQ time series, and therefore, can be used for demodulation, subsequent FFT, or any other appropriate processing. The technique does not take additional sweeps, so there is no time penalty associated with this method. Furthermore, LO dithering can be applied continuously in real-time with LO and an field-programmable gate array (FPGA) so that even long IQ recording with correction is possible and there is no need for post processing.

However, some limitations for this technique include the need for LO and digital architecture that supports dithering or chirping. This may limit the phase-noise-optimization modes available on the analyzer. The technique also requires perfect synchronization between physical and digital dithering and relatively slat amplitude and group delay throughout RD/IF chain. Errors can result in higher sidebands around the carrier. Also, with this technique, all of the spurious energy (the spurs) is still present but is no longer concentrated at one frequency.

Therefore, new techniques and devices are needed to address residual spurs in signal analyzers.

SUMMARY

In accordance with this disclosure, methods, devices, and systems for coherent time-gated residual spur characterization and correction in signal analyzers are provided. In one aspect, a method for reducing spurious signal energy in a signal analyzer is provided, the method comprising:

displaying a signal on the display of the signal analyzer that is present without an input signal being provided to an input of the signal analyzer; establishing a predetermined amplitude threshold above which energy spikes in the signal being displayed on the display of the signal analyzer are considered spurious; automatically identifying one or more spurious energy spikes in the signal being displayed on the display of the signal analyzer based on the predetermined amplitude threshold; and automatically reducing or removing the one or more spurious energy spikes from the signal being displayed on the display of the signal analyzer.

In some embodiments, establishing the predetermined amplitude threshold comprises: automatically determining a standard deviation of energy levels in the signal being displayed on the display of the signal analyzer without the input signal being provided to the input of the signal analyzer; and automatically setting the predetermined amplitude threshold to be N of the standard deviation above a root mean square (RMS) value of the energy levels displayed, N being a non-negative number. In some further embodiments, automatically identifying one or more spurious energy spikes includes classifying portions of a frequency domain representation of the signal being displayed on the display into frequency bins and identifying frequency bins corresponding to portions of the frequency domain representation of the signal having amplitudes above the predetermined amplitude threshold as spurious energy spikes.

In some embodiments, automatically reducing or removing the one or more spurious energy spikes comprises: automatically creating a sparse array storing values representing a frequency spectrum of the one or more spurious energy spikes; automatically performing an inverse fast Fourier transform (IFFT) of the values stored in the sparse array to obtain a time-domain array having values representing the one or more spurious energy spikes; automatically subtracting values in the time-domain array representing the one or more spurious energy spikes from a summation of values representing the spurious energy spikes displayed on the display of the signal analyzer and values representing the input signal to be measured; and automatically updating display of the signal being displayed by the display of the signal analyzer to reflect the reduced or removed spurious energy spikes.

In some embodiments, creating the sparse array comprises extrapolating the spectrum beyond a pre-signal interval. In some further embodiments, the pre-signal interval is an interval on the display of the signal analyzer where an input signal is not received by the signal analyzer. In some embodiments, the method is automatically performed after powering on the signal analyzer; or wherein the method is automatically performed after a predetermined time period; or wherein the method is performed after a user of the signal analyzer initiates the method by pressing a button, turning a knob, or other triggering mechanism.

In another aspect a device for reducing or removing spurious energy spikes on a display of a signal analyzer is provided, the device comprising: one or more processors or other circuitry configured to: display a signal on the display of the signal analyzer that is present without an input signal being provided to an input of the signal analyzer; establish a predetermined amplitude threshold above which energy spikes in the signal being displayed on the display of the signal analyzer are considered spurious; automatically identify one or more spurious energy spikes in the signal being displayed on the display of the signal analyzer based on the predetermined amplitude threshold; and automatically reduce or remove the one or more spurious energy spikes from the signal being displayed on the display of the signal analyzer.

In some embodiments, in order to establish the predetermined amplitude threshold, the one or more processors or other circuitry is further configured to: automatically determine a standard deviation of energy levels in the signal being displayed on the display of the signal analyzer without the input signal being provided to the input of the signal analyzer; and automatically set the predetermined amplitude threshold to be N of the standard deviation above a root mean square (RMS) value of the energy levels displayed, N being a non-negative number. In some embodiments, the one or more processors or other circuitry are configured to classify portions of a frequency domain representation of the signal being displayed on the display into frequency bins and frequency bins corresponding to portions of the frequency domain representation of the signal having amplitudes above the predetermined amplitude threshold are identified as spurious energy spikes.

Additionally, in some further embodiments, in order to automatically reduce or remove the one or more spurious energy spikes, the one or more processors or other circuitry is configured to: automatically create a sparse array storing values representing a frequency spectrum of the one or more spurious energy spikes; automatically perform an inverse fast Fourier transform (IFFT) of the values stored in the sparse array to obtain a time-domain array having values representing the one or more spurious energy spikes; automatically subtract values in the time-domain array representing the one or more spurious energy spikes from a summation of values representing the spurious energy spikes displayed on the display of the signal analyzer and values representing the input signal to be measured; and automatically update display of the signal being displayed by the display of the signal analyzer to reflect the reduced or removed spurious energy spikes.

In some embodiments, the one or more processors or other circuitry is configured to create the sparse array by extrapolating the spectrum beyond a pre-signal interval. In some further embodiments, the pre-signal interval is an interval on the display of the signal analyzer where an input signal is not received by the signal analyzer. In some embodiments, the one or more processors or other circuitry is configured to automatically reduce or remove the one or more spurious energy spikes from the signal being displayed on the display of the signal analyzer after powering on the signal analyzer; wherein the one or more processors or other circuitry is configured to automatically reduce or remove the one or more spurious energy spikes from the signal being displayed on the display of the signal analyzer after a predetermined time period; or wherein the one or more processors or other circuitry is configured to automatically reduce or remove the one or more spurious energy spikes from the signal being displayed on the display of the signal analyzer after a user of the signal analyzer initiates the method by pressing a button, turning a knob, or other triggering mechanism.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

DETAILED DESCRIPTION

The present subject matter provides example embodiments of methods, devices, and systems for characterizing residual spurious energy spikes (spurs) on the display of a signal analyzer. The embodiments, of the present disclosure are designed to characterize and correct for residual spurs which are present on the display of the signal analyzer regardless if a signal input is present. The frequency and amplitude of the residual spurs are independent of the input signal. The residual spurs can be caused by local oscillator (LO) leakages, a "DC offset" in the homodyne receiver, harmonics of the local oscillator mixing with one another, analog to digital converter (ADC) interleave spurs, and crosstalk or interference where there is insufficient shielding.

Figure 1A:
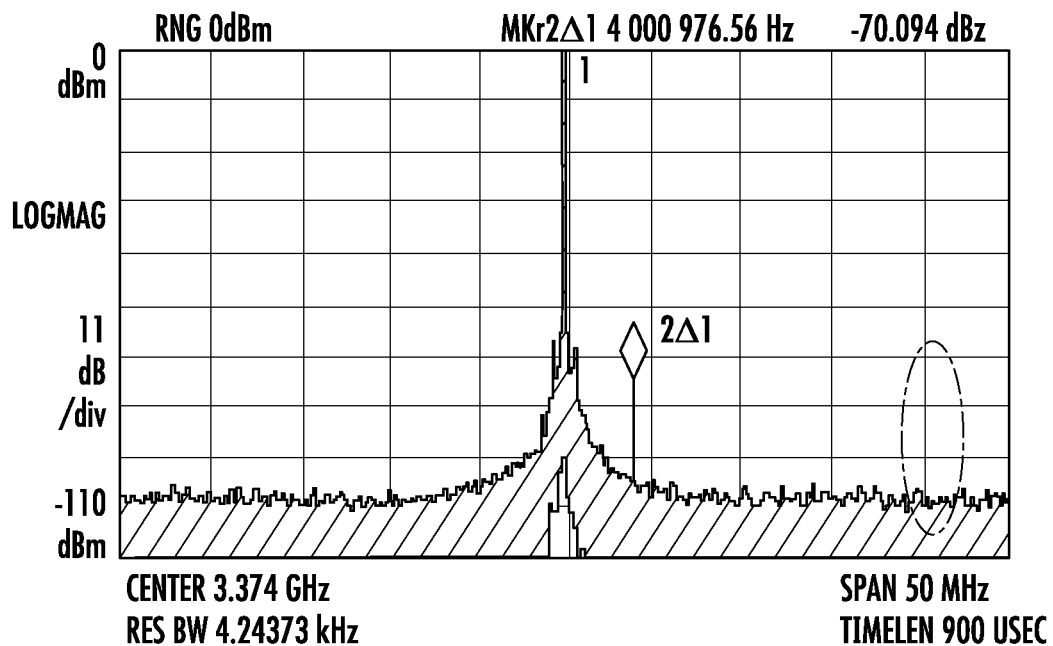
FIG. 1A and FIG. 1B illustrate example spectrum charts highlighting input-related spurs.
Figure 1B:
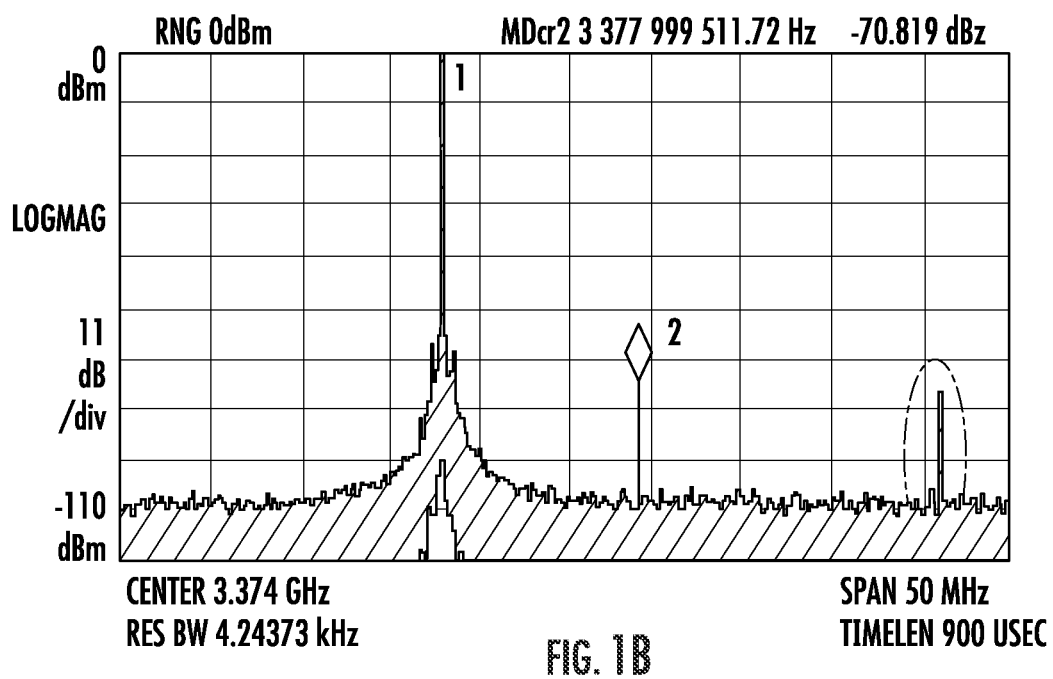
Figure 2A:
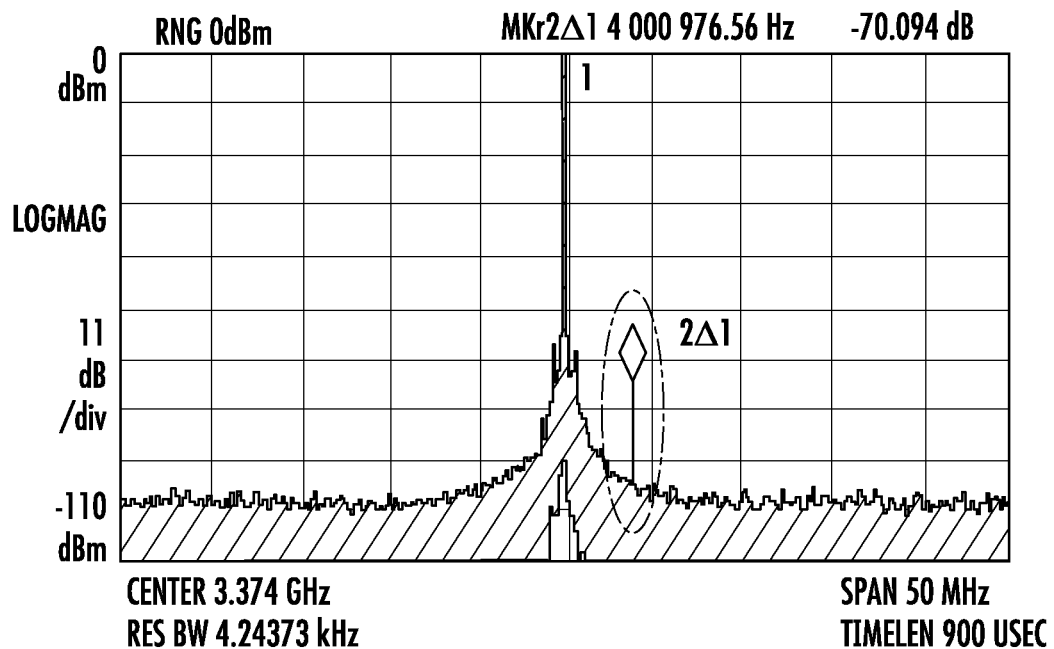
FIG. 2A and FIG. 2B illustrate example spectrum charts highlighting residual spurs.
Figure 2B:
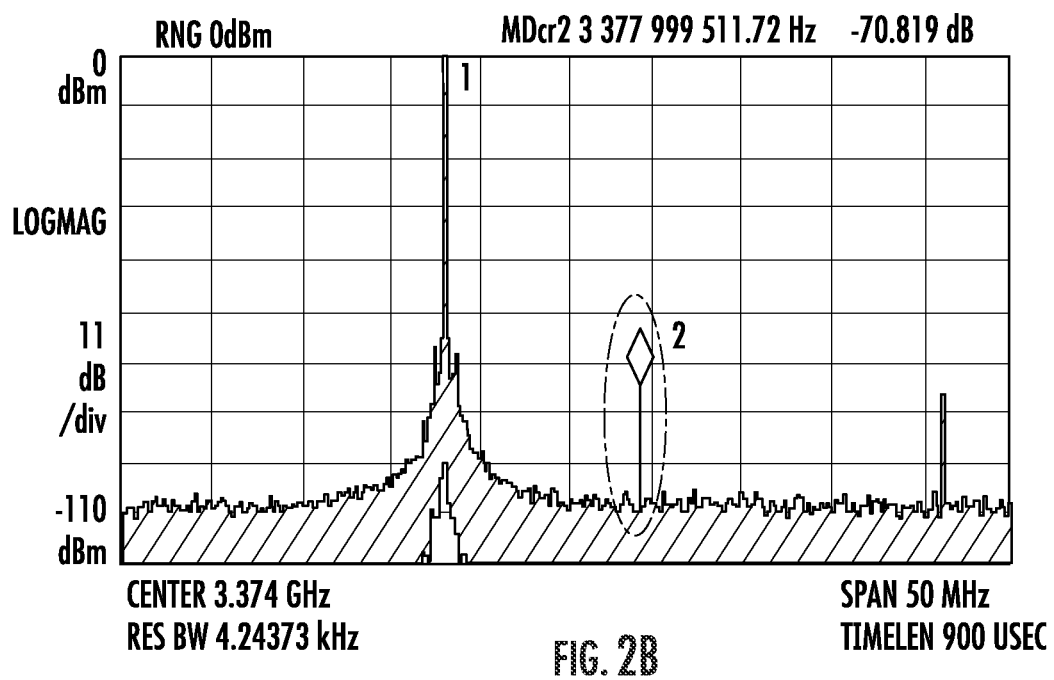
Figure 3A:
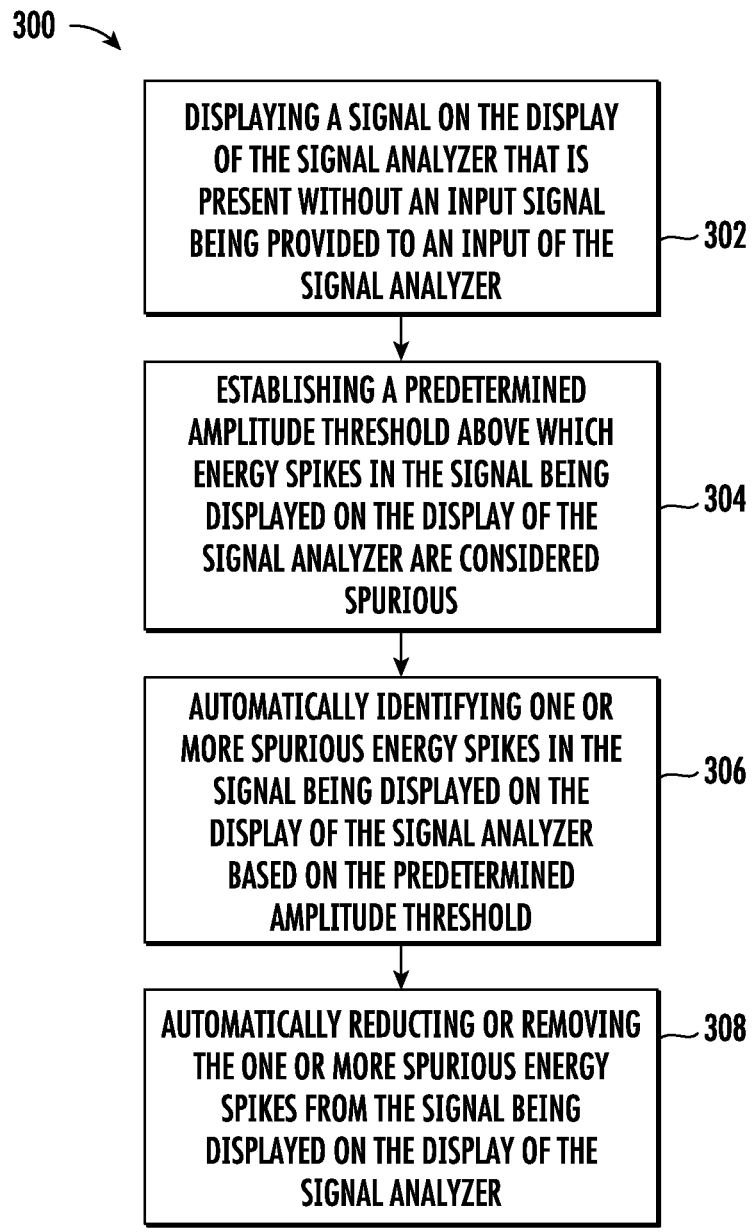
FIG. 3A, FIG. 3B, and FIG. 3C illustrates example steps in a method for coherent time-gated residual spur characterization and correction in signal analyzers according to some embodiments of the present disclosure.
Figure 3B:
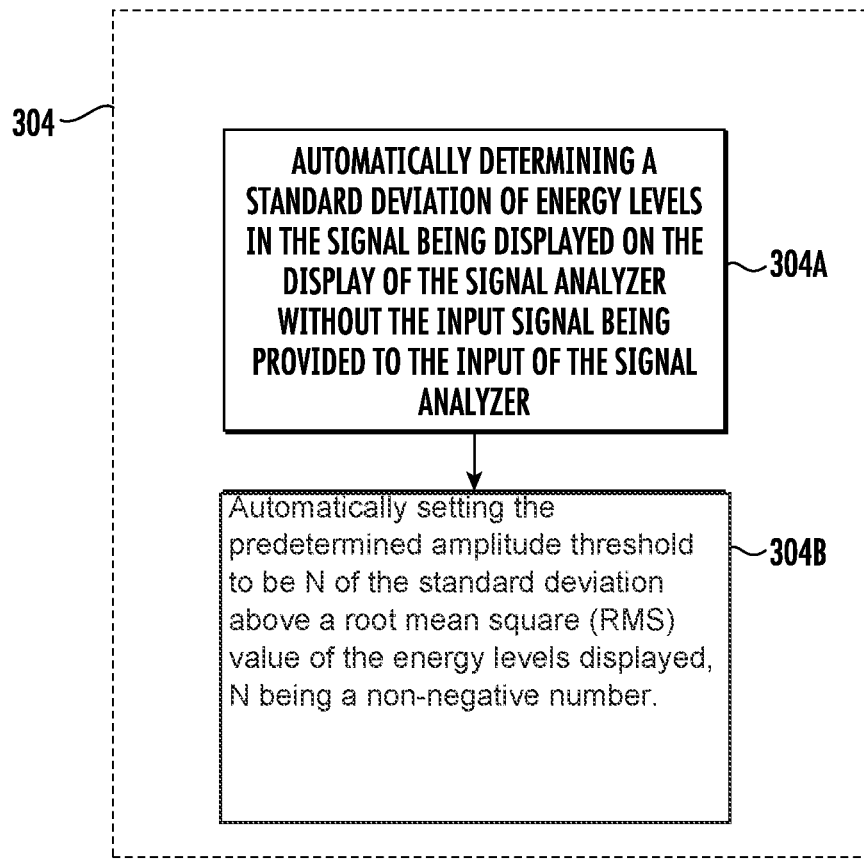
Figure 3C:
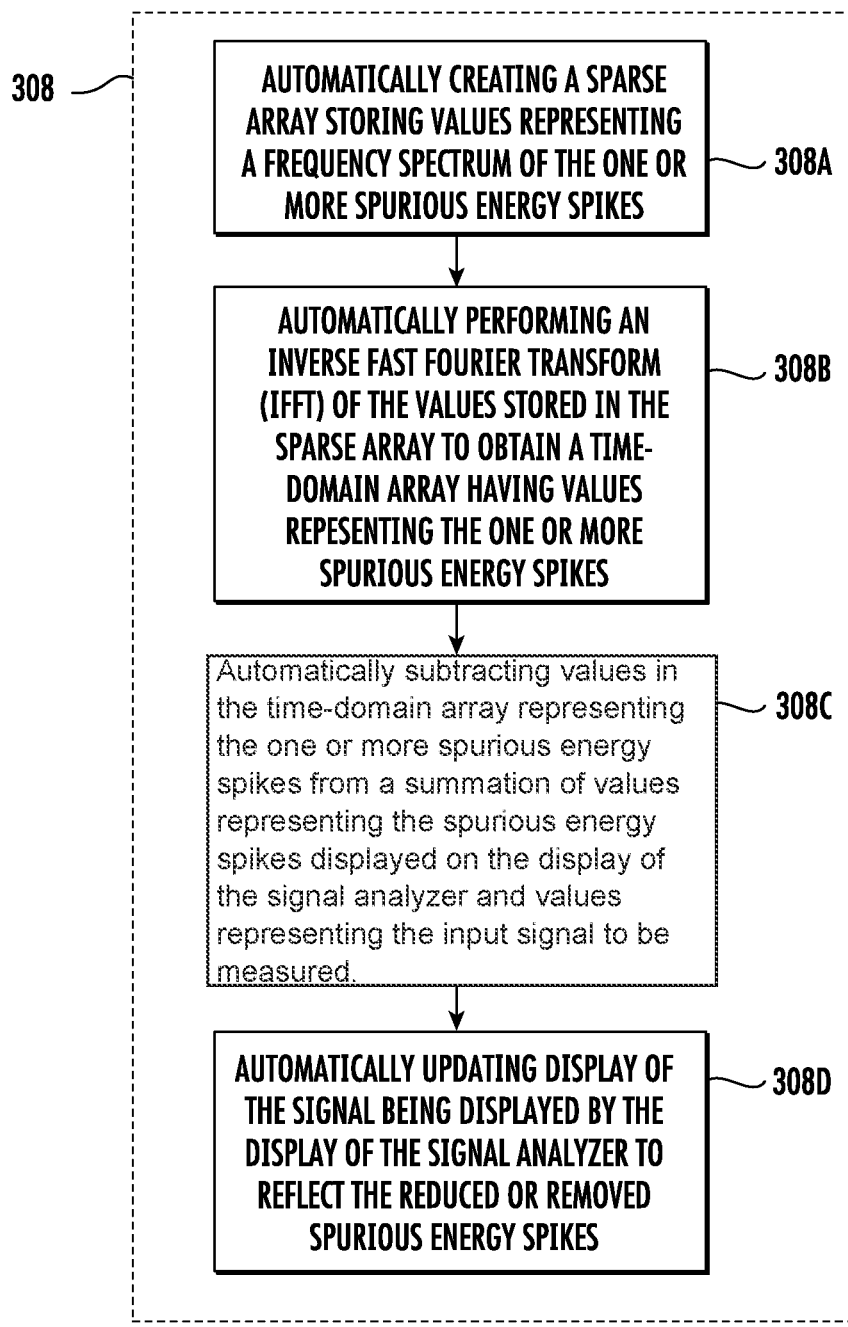

Referring to figures, specifically, FIG. 3A, FIG. 3B, and FIG. 3C, which illustrate flow charts of a method 300 for reducing or removing residual spurious energy spikes on a display of a signal analyzer according to some embodiments of the present disclosure. FIG. 3A depicts a high-level illustration of the method 300, FIG. 3B depicts a more detailed flow chart of what occurs in the second step 304 of the method 300, and FIG. 3C depicts a more detailed flow chart of what occurs in the fourth step 308 of the method 300. In some embodiments, the method 300 is a computer, processor, or circuit-implemented method that can be implemented by one or more processors, or other circuitry such as, for example and without limitation, an application specific integrated circuit (ASIC), a field programmable logic array (FPGA), a controller, an integrated circuit, or other circuitry. As described herein, in some embodiments, the method 300 can be implemented onboard a signal analyzer, or it can be performed by one or more processors or other circuitry external to the signal analyzer and the signal analyzer can receive the display update information described herein and update its display according to the received update information.

Although the present method 300 is described in a linear manner, the present disclosure should not be read as limiting the present subject matter to this linear set of steps. In some embodiments, the steps in the method 300 can be performed out of order or can be performed multiple times, subsequently or out of order, depending on what is displayed on the display of the signal analyzer and depending on when the method is triggered by the signal analyzers. Furthermore, in some embodiments, the method 300 can begin at any step in the flow chart shown and after completing a step, the method can go back to that step before completion of the method. With that being said, in some other embodiments, the method 300 proceeds as described herein.

Additionally, in some embodiments, the method 300 of the present disclosure is performed without an input signal being present on the display of the signal analyzer or without a signal input being connected or active on the signal analyzer. In some embodiments, the method 300 of the present disclosure is performed with a signal input connected, but with a switch or other device disconnecting the signal input from being displayed on the display of the signal analyzer.

In some embodiments, a first step 302 in the method 300 comprises displaying a signal on the display of the signal analyzer that is present without an input signal being provided to an input of the signal analyzer.

Although the present disclosure describes the method 300, systems, and devices herein in terms of a display or displayed signal, in some embodiments, a display need not be included at all. For example and without limitation, the same principles described herein can be used when the display is off and the user retrieves the spectrum or time-domain data programmatically without the analyzer's display enabled. In some other embodiments, the spectrum is measured or calculated, but not necessarily displayed. In some embodiments, a second step 304 in the method 300 comprises establishing a predetermined amplitude threshold above which energy spikes in the signal being displayed on the display of the signal analyzer are considered spurious. In some embodiments, the third step 306 in the method 300 comprises automatically identifying one or more spurious energy spikes in the signal being displayed on the display of the signal analyzer based on the predetermined amplitude threshold. In some cases, automatically identifying one or more spurious energy spikes includes classifying portions of a frequency domain representation of the signal being displayed on the display into frequency bins and identifying frequency bins corresponding to portions of the frequency domain representation of the signal having amplitudes above the predetermined amplitude threshold as spurious energy spikes. In some embodiments, the fourth step 308 in the method 300 comprises automatically reducing or removing the one or more spurious energy spikes from the signal analyzer display.

In some embodiments, the second step 304 comprises a series of sub-steps. For example and without limitation, the second step 304 comprises a first sub-step 304A comprising automatically determining a standard deviation of energy levels in the signal being displayed on the display of the signal analyzer without the input signal being provided to the input of the signal analyzer. In some embodiments, the second step 304 comprises a second sub-step 304B comprising automatically setting the predetermined amplitude threshold to be N of the standard deviation above a root mean square (RMS) value of the energy levels displayed, N being a non-negative number selected such that the threshold is chosen to meet the required spur-free dynamic range (i.e., N at the low end) and have high enough confidence that identified spurs are not random noise (i.e., N at the high end).

The higher N is (it is always a non-negative number) the less likely that a frequency point over this threshold is just random noise which cannot be subtracted out (because the amplitude and phase are random). But as N gets higher, it identifies fewer spurs so it would leave alone spurs that are below the threshold. In some embodiments, an ideal "derived" value for N is based on the cumulative distribution function (CDF) of the noise samples. Assuming the real and imaginary parts of the noise frequency bins are normally distributed (generally true), then the magnitude is Rayleigh distributed, wherein the magnitude equals:

Magnitude=√(real²+imag²).

The CDF of a Rayleigh distribution is:

$$CDF = 1 - e^{\left(-\frac{(\frac{x}{\sigma})^2}{2}\right)}.$$

So, if for example and without limitation, an example embodiment chose x=4*σ (that is, N=4) then CDF(4*σ)=99.97%. This means that the point over this threshold is a spur (and not noise) with 99.97% confidence. A very low probability that noise just happened to peak that high. One can use the inverse CDF to determine N given an acceptable confidence level 0<p<1 that the signal above the threshold is indeed a spur. In that case:

$N=\sqrt{(-2*\ln(1-p))}.$

More completely, sigma will change over the bandwidth of the measurement (the noise power isn't perfectly flat across bandwidth) so one could estimate sigma as a function of frequency by calculating it based on adjacent 100 frequency bins or so.

The key is to set the predetermined amplitude threshold low enough to capture the spurious energy spikes in the filter, but not so low that it actually includes the signal or other important information. In some embodiments, the predetermined amplitude threshold comprises a maximum energy spike or spur threshold and any energy spur whose amplitude is above the maximum energy spike threshold is not identified as spurious energy spikes and thereby not reduced or eliminated from the signal analyzer display.

In some embodiments, in the third step 306, automatically identifying one or more spurious energy spikes includes classifying portions of a frequency domain representation of the signal being displayed on the display into frequency bins and identifying frequency bins corresponding to portions of the frequency domain representation of the signal having amplitudes above the predetermined amplitude threshold are identified as spurious energy spikes. In other words, energy spikes at displayed frequencies whose amplitude is greater than the predetermined amplitude threshold (i.e., the threshold determined in the second step 304) are identified by the one or more processors or other circuitry as spurious energy spikes.

In some embodiments, the fourth step 308 comprises four sub-steps illustrated in FIG. 3C. For example and without limitation, in some embodiments, the fourth step 308 comprises a first sub-step 308A comprising automatically creating a sparse array storing values representing a frequency spectrum of the one or more spurious energy spikes. In some embodiments, the fourth step 308 comprises a second sub-step 308B comprising automatically performing an inverse fast Fourier transform (IFFT) of the values stored in the sparse array to obtain a time-domain array having values representing the one or more spurious energy spikes. In some embodiments, the fourth step 308 comprises a third sub-step 308C comprising automatically subtracting values in the time-domain array representing the one or more spurious energy spikes from a summation of values representing the spurious energy spikes displayed on the display of the signal analyzer and values representing the input signal to be measured. In some embodiments, the fourth step 308 comprises a fourth sub-step 308D comprising automatically updating display of the signal being displayed by the display of the signal analyzer to reflect the reduced or removed spurious energy spikes.

In some embodiments, creating the sparse array comprises extrapolating the spectrum beyond a pre-signal interval. The pre-signal interval is an interval on the display of the signal analyzer where an input signal is not received by the signal analyzer. In particular, in some embodiments, the sparse array of the one or more spurious energy spikes can be created independent of an input signal being received by the signal analyzer.

As described above, each of these steps is performed by the one or more processors or other circuitry and can be performed at any time frame with respect to the operation of the signal analyzer. For example, and without limitation, in some embodiments, the method is configured to be performed by the one or more processor of the signal analyzer at start-up (i.e., powering on and starting the signal analyzer), after a predetermined time-period (i.e., every hour after the signal analyzer has been powered on, every 10, 15, 20, 30, or 45 minutes after the signal analyzer has been powered on, or any other suitable time period based on the characteristics of the signal analyzer or any other relevant considerations), after being triggered to perform the method by a user (i.e., via a button, selector, knob, or other input), after any event which might cause the residual spurs to change (i.e., other than by the method of the present disclosure).

The following description of some of the figures illustrate various energy charts and spectra that help illustrate the steps and effects of the above described method. Furthermore, the description below will give more detail on the above described method.

Referring to FIG. 4A through FIG. 4D, FIG. 4A illustrates a power-versus-time profile of a bursted Wi-Fi signal in the time domain. To illustrate performing the method of the present disclosure without a signal being present, analysis is performed in FIG. 4A through FIG. 4D in the pre-trigger area 402, between the vertical dashed lines in FIG. 4A. As described herein, the spectrum identification of the residual spurs occurs when no signal is present. In some embodiments, triggering the start of the method can be performed manually (i.e., after a button is pressed or knob is turned) while a user of the signal analyzer knows the input is not connected. Or the method can begin automatically by timer or some other triggering event. In this case, the signal analyzer will need to ensure that the input signal is not connected. In some embodiments, the triggering mechanism can include software commands via the signal analyzer's API, instrument alignments that are triggered by the passage of a pre-determined time period or a change in temperature.

In some embodiments, to ensure that the input is not connected, the signal analyzer can comprise a high-isolation switch or "mute" switch in hardware configured to connect and disconnect the input signal at the appropriate time for the spur correction method to be performed. If implemented at radio frequency (RF) input, all downstream spur sources could be characterized and removed. If implemented at intermediate frequency (IF) right before the analog to digital converter (ADC), only ADC residual spurs would be corrected or removed. In some embodiments, the high-isolation switch or "mute" switch can be implemented at the RF input. In other embodiments, the high-isolation switch or "mute" switch can be implemented at the IF.

In some further embodiments, the switch can be implemented as an alignment run between acquisitions. In this case, it would still require a "mute" switch to disconnect the signal input, but the switch could be electromechanical or it could require the user to disable the input signal manually. This would require the residual spurs to have very stable magnitudes and phase if the alignment is only performed every few minutes. Various embodiments for disconnecting or ensuring that the input signal remains disconnected while the spurs are being characterized are envisioned, including, but not limited to some of the approaches described above.

Figure 4A:
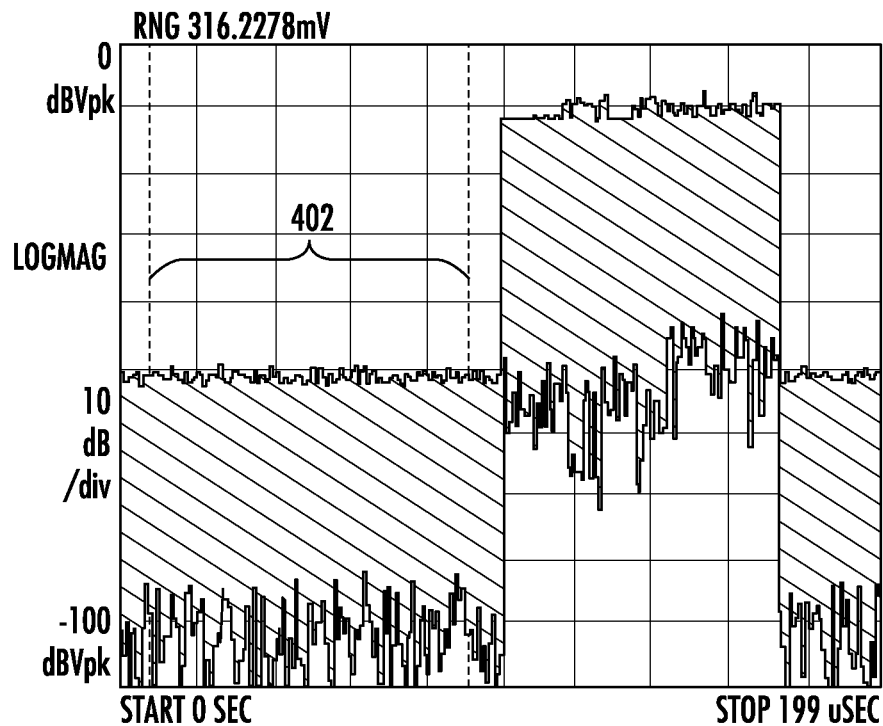
FIG. 4A through FIG. 4D illustrate various profiles of a signal analyzer display where spurious energy levels are being isolated.
Figure 4B:
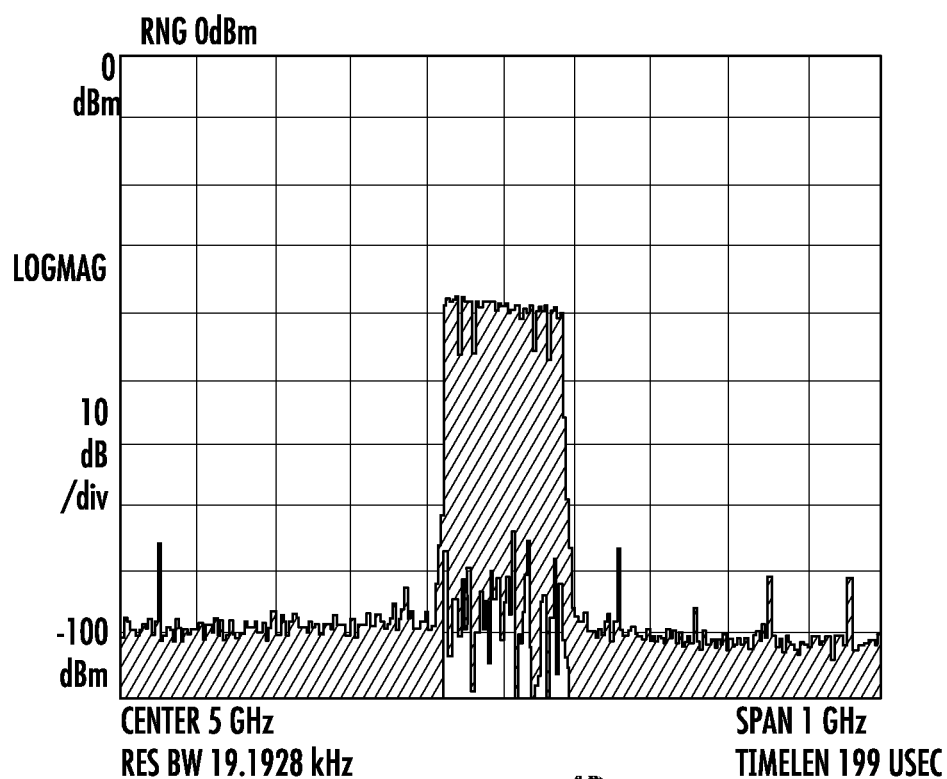
Figure 4C:
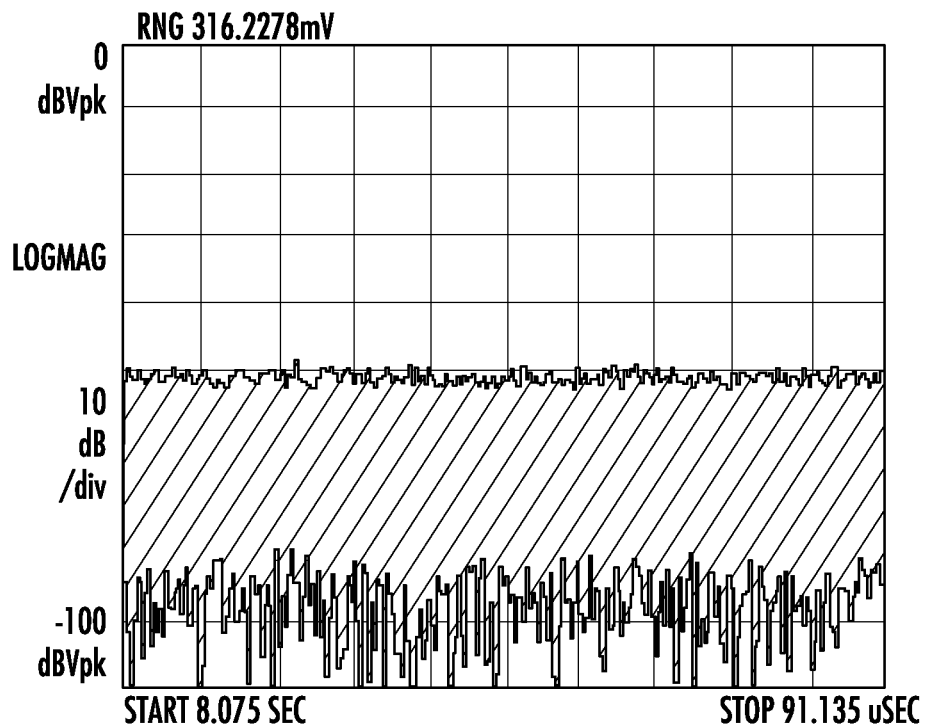
Figure 4D:
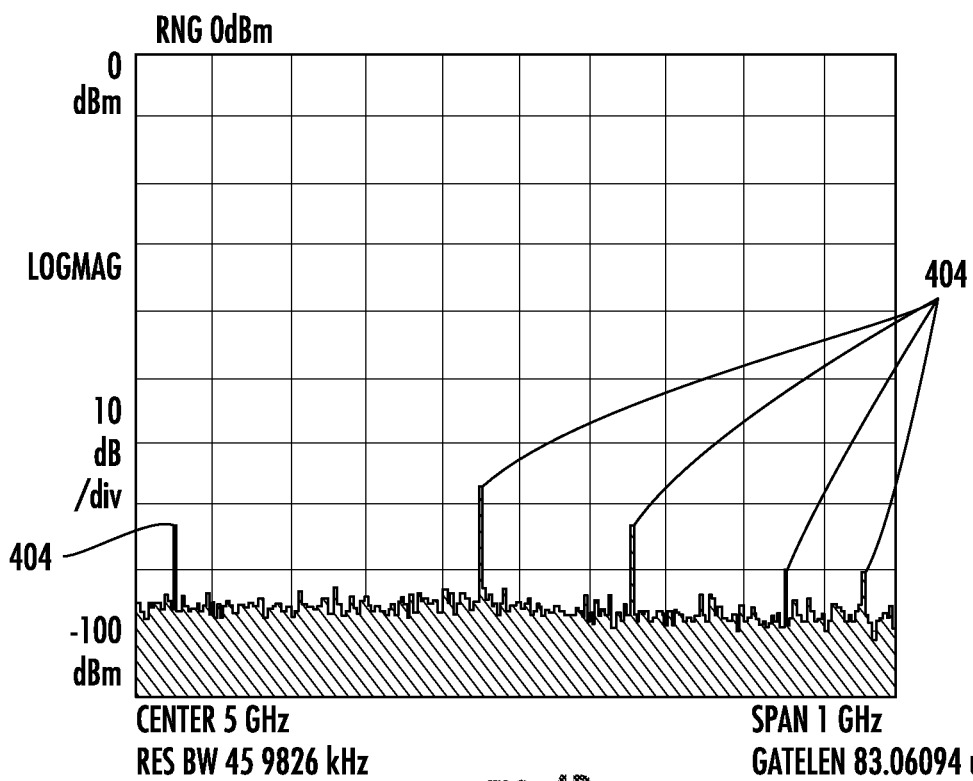

FIG. 4B illustrates the frequency domain spectrum (i.e., a fast Fourier transform [FFT]) of the time-domain chart in FIG. 4A. FIG. 4C illustrates the time domain representation of the portion of FIG. 4A between the vertical dotted lines (i.e, the pre-trigger interval before the signal is present). FIG. 4D illustrates the frequency domain spectrum of the time domain representation of FIG. 4C. The energy spikes illustrated in FIG. 4D depict the residual spurs 404. The residual spurs 404 depicted in FIG. 4D are present even as no input signal is present (no signal is present in the pre-triggered region 402, which FIG. 4D is a spectrum of). These are the residual spurious energy spikes (spurs) that the methods, devices and systems of the present disclosure are configured to identify and then reduce or eliminate.

Figure 5A:
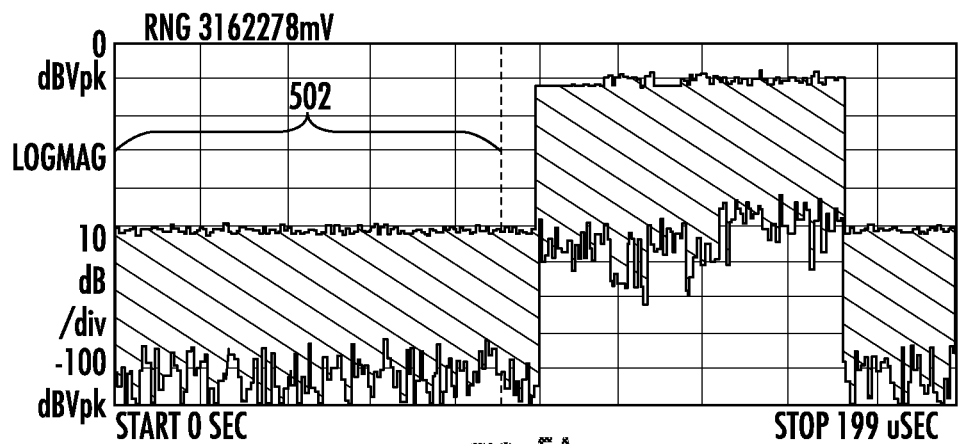
FIG. 5A through FIG. 5G illustrate various profiles of a signal analyzer display at a pre-trigger interval where spurious energy levels are being isolated without a signal being present as well as a chart illustrating how to identify amplitude and phase trajectories of the spurious energy spikes.
Figure 5B:
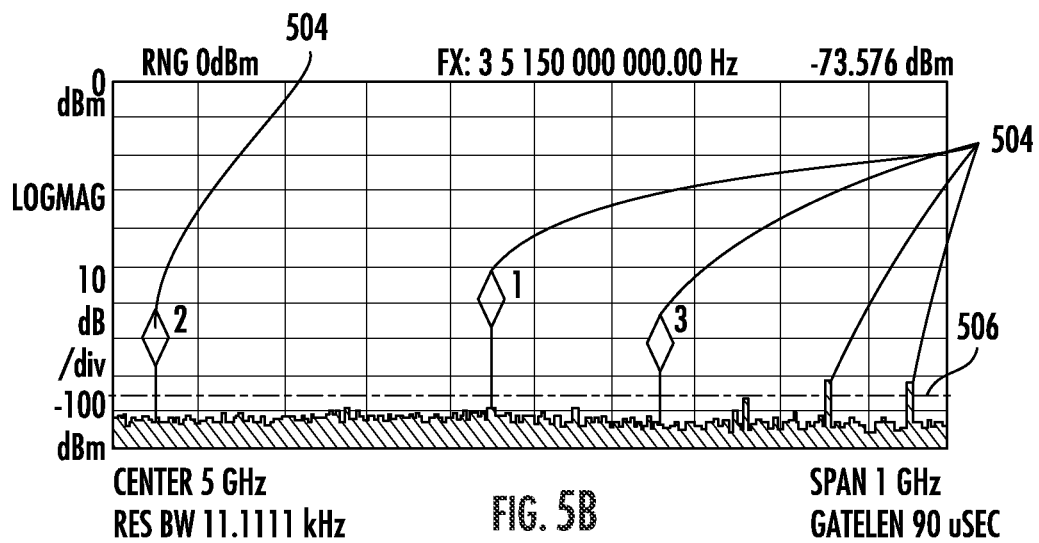

Referring to FIG. 5A through FIG. 5F, FIG. 5A illustrates the same power-versus-time profile of the bursted Wi-Fi signal as FIG. 4A above, with a pre-trigger interval 502 identified as being the section of the chart without an input signal present between the vertical dotted lines. The chart in FIG. 5A can be termed IQ data, as defined above. FIG. 5B illustrates the frequency domain spectrum of the pre-trigger interval 502 of the chart in FIG. 5A and the residual spurious energy spikes, or residual spurs 504, are displayed and clearly visible.

As described above, the first step in the method is to establish a predetermined amplitude threshold at which energy spikes on the display are considered spurious or considered as spurs. This step is illustrated by the horizontal threshold line 506 in FIG. 5B. In essence, energy spikes with amplitudes above this horizontal threshold line 506 are to be considered as spurious energy spikes or spurs. In some embodiments, in order to determine at what amplitude the threshold should be set, the method comprises measuring a standard deviation of energy levels displayed on the display of the signal analyzer (i.e., when the input signal is not present). Once the standard deviation of the energy levels is measured, the method comprises setting the predetermined amplitude threshold to be some multiple N (i.e., as described above) of the standard deviations above a root mean square (RMS) value of the energy levels displayed.

This determines the level or amplitude at which the horizontal line 506 is set. Note, the display of the horizontal line 506 is for illustrative purposes only and is not actually a part of the method, but rather included in the figure to help understand the method of the present disclosure. The method comprises setting the predetermined amplitude threshold, which is illustrated by the horizontal line 506. After setting the predetermined amplitude threshold, the processor or other circuitry performing the method then automatically identifies one or more spurious energy spikes by classifying portions of a frequency domain representation of the signal being displayed on the display into frequency bins and identifying frequency bins corresponding to portions of the frequency domain representation of the signal having amplitudes above the predetermined amplitude threshold, horizontal line 506, are identified as spurious energy spikes. In some embodiments, the method comprises selecting the interval length so the FFT grid falls exactly on known spurs. Alternatively, some embodiments can include using frequency-estimation methods such as parabolic fitting, multiple signal classification (MUSIC), or other suitable method to identify frequencies where residual spurs are present in the frequency domain spectrum.

Once the frequency bins of each residual spur is identified as having an amplitude above the predetermined amplitude threshold in the previous steps, the method comprises creating a sparse array representing the spurious spectrum. FIG. 5D illustrates such a spectrum. Here, the spectrum depicts the frequency domain representation of the estimated amplitude and phase of each spur. In some embodiments, it is assumed that the amplitude and frequency of the spurs are constant over the duration of the entire capture and thus, the sparse array generated above can be extrapolated beyond the pre-trigger interval 502. Amplitude and frequency are constant but phase is not. The phase changes over time as shown in the phase trajectory plots. The slope of the phase is the frequency (deg/sec or rotations/sec which is just Hz). The initial phase at the start of the pre-signal interval where the spurs are characterized is the y-intercept of the plots in FIG. 5G below. From the slope and y-intercept the phase can be extrapolated to any later point in time. Amplitude is always assumed to be constant.

Figure 5C:
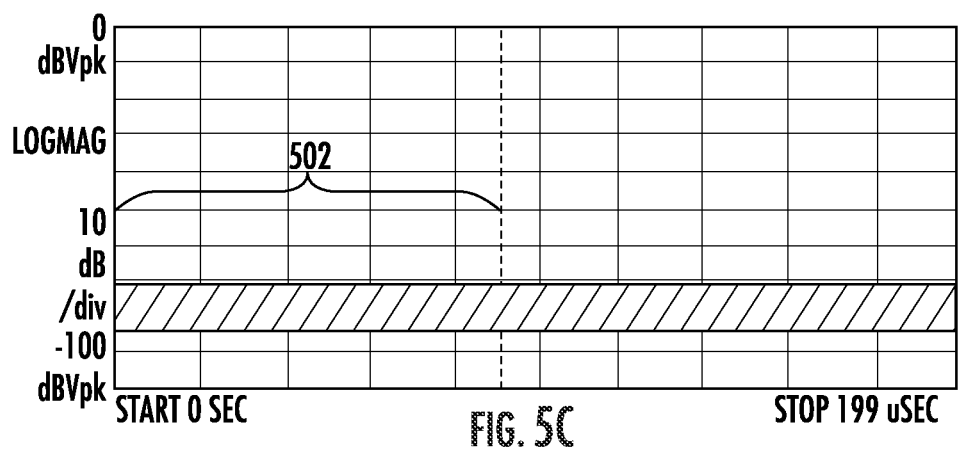
Figure 5D:
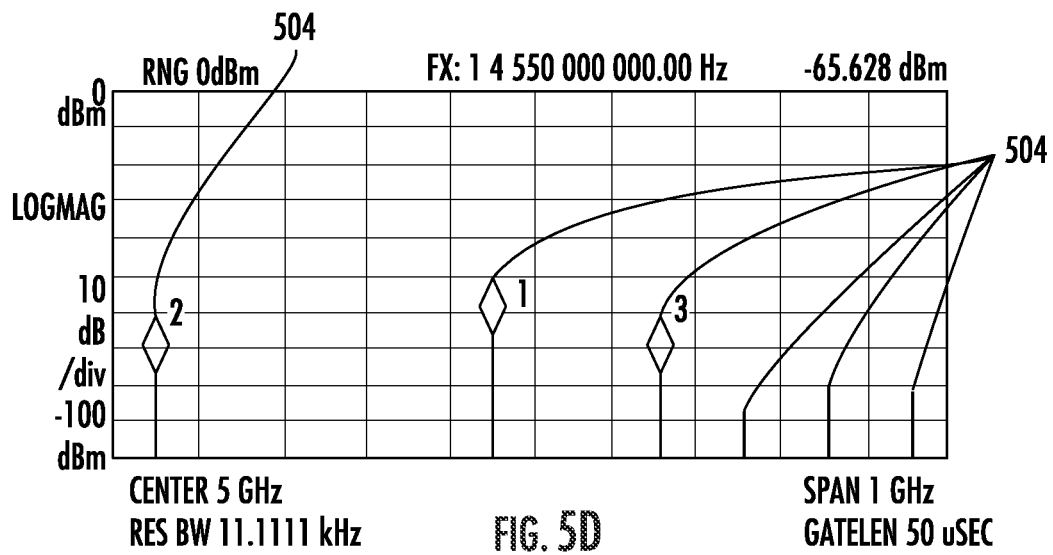

FIG. 5C illustrates the inverse fast Fourier transform (IFFT) of the frequency spectrum of the spurs displayed in FIG. 5D. FIG. 5C illustrates a time domain summation of sinusoids, each sinusoid corresponding to a respective spur from FIG. 5D. This summation of sinusoids and be represented by the function:

$$\hat{s}(t) = \Sigma_i m_i e^{j2\pi(f\_i)t + (\varphi\_i)}.$$

As described herein, because this is a sparse array of continuous wave signals, those having ordinary skill in the art will appreciate that in some embodiments, the method can be implemented by one or more processors, one or more FPGA, or one or more ASICs. Amplitudes and phases can be accurately measured with FFT techniques. Frequencies of the residual spurs are often known due to knowledge of the architecture of the instrument but can also be estimated with techniques mentioned above. The description related to FIG. 5G has more detail on identifying the amplitude and phase trajectories of the spurs and thereby, estimations of the frequencies of the spurs.

Once the time-domain function of the residual spur array is calculated (i.e., ŝ(t)), it can be subtracted from the original IQ data (i.e., FIG. 5A) to produce the corrected (i.e. spur-free or spur reduced) IQ data. If the original IQ data can be represented by the function x(t), then the time domain function of the corrected IQ data would be:

$$\hat{x}(t) = x(t) - \hat{s}(t).$$

Figure 5E:
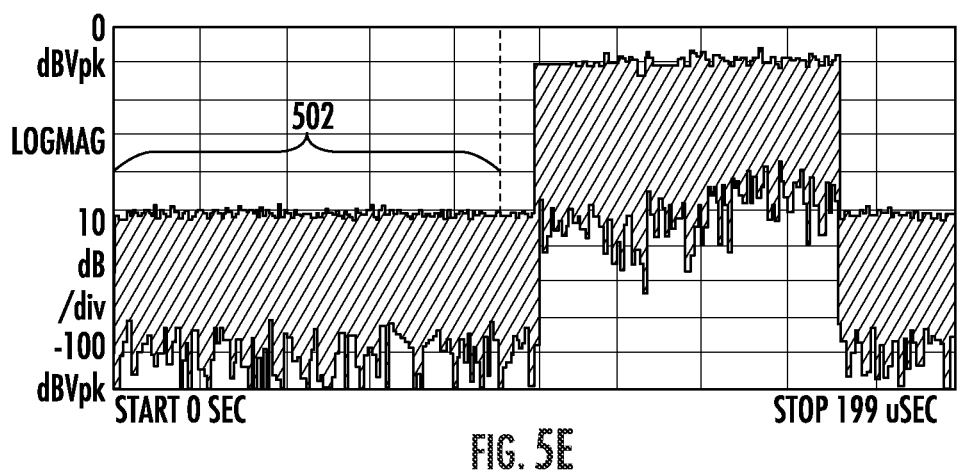
Figure 5F:
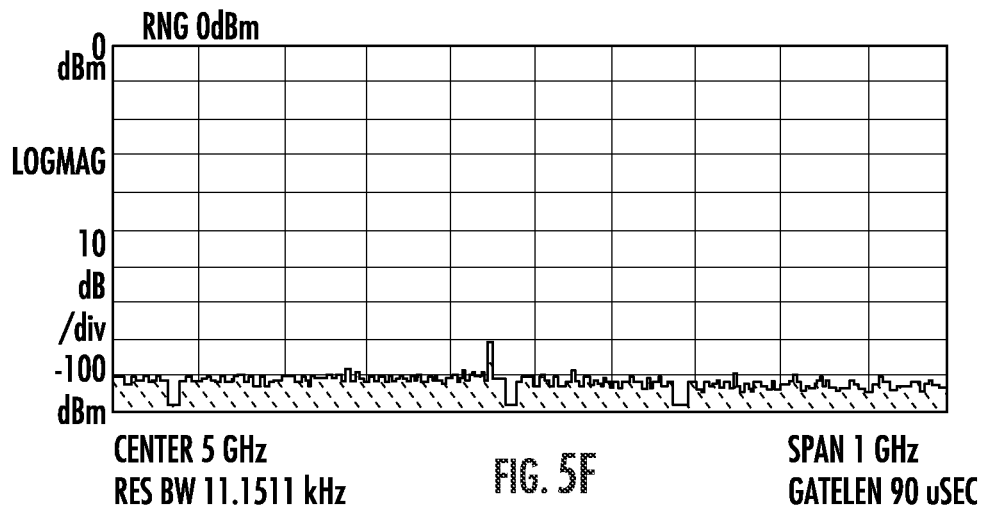

FIG. 5E illustrates the time domain signal, $\hat{x}(t)$, of the corrected IQ data. In other words, the time-domain array depicted in FIG. 5C is subtracted from the time-domain IQ data of FIG. 5A. As shown in FIG. 5F, which is the frequency-domain spectrum of the time-domain signal illustrated in FIG. 5E, the spurious energy spikes that were clearly present in FIG. 5B are no longer present in FIG. 5F.

Figure 5G:
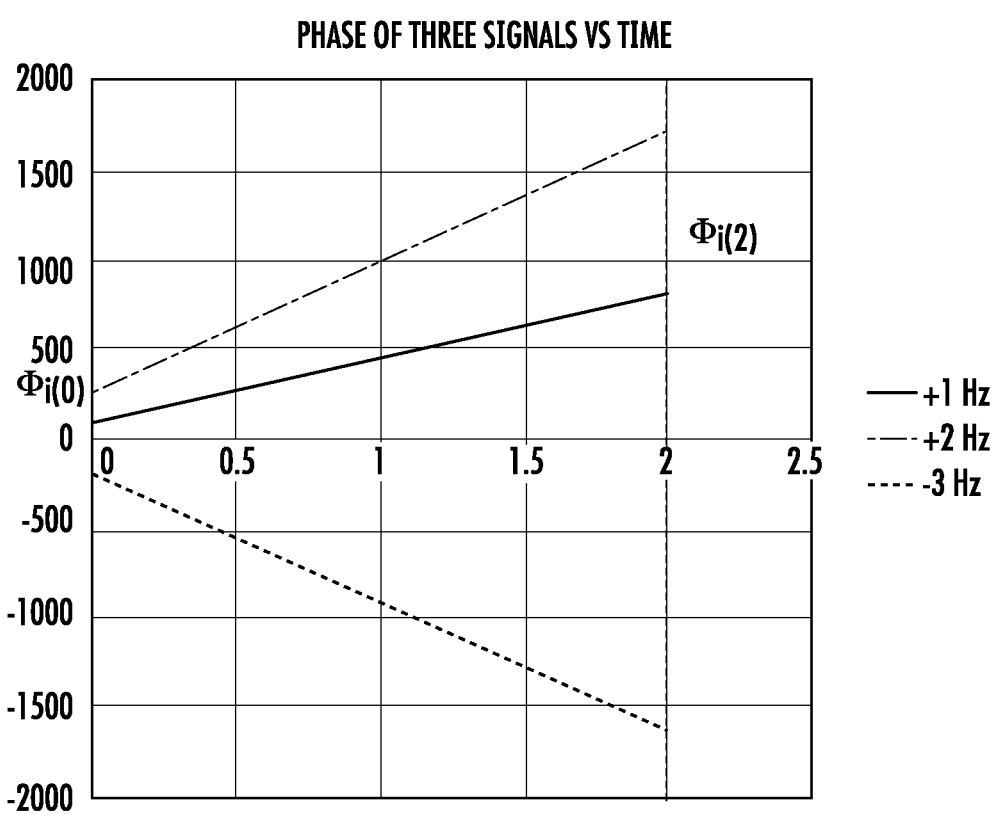

Referring to FIG. 5G, which helps to illustrate the techniques for estimating the amplitude and phase trajectories of the spurs. FIG. 5G is a plot of the phase of three signals v. time. The goal is to take the amplitude, phase, and frequency (i.e., the slope of phase versus time of the signal) to create a phase trajectory of the spur. Once this information is obtained by the one or more processors, FPGA, ASIC, etc., at any later point in time, the processor(s) can determine the residual spur's amplitude (constant), phase (not constant), and frequency (constant). Amplitude, frequency, and initial phase are determined by detecting the FFT bins above the pre-determined threshold (just save their values which are amplitude and phase and the FFT bin they reside in which is frequency). This is enough to calculate the complex value of the spurs at a later time since the phase trajectory is just a straight line.

The spur-characterization that occurs in the pre-signal interval gives the slope (frequency) and y-intercept (initial phase) so that it can be calculated at any future time what the phase of the spur is so that the methods, systems, and devices of the present subject matter can add in a spur with the same amplitude and opposite phase. In some embodiments, a counter or other suitable memory device can be implemented in the processor, ASIC, or FPGA to count how many samples have elapsed between spur characterization alignment and a trigger event. This elapsed time can then be used by software (or the ASIC or FPGA) to update the amplitude, phase, and frequency of the residual for later subtraction, which is described further herein.

Figure 6A:
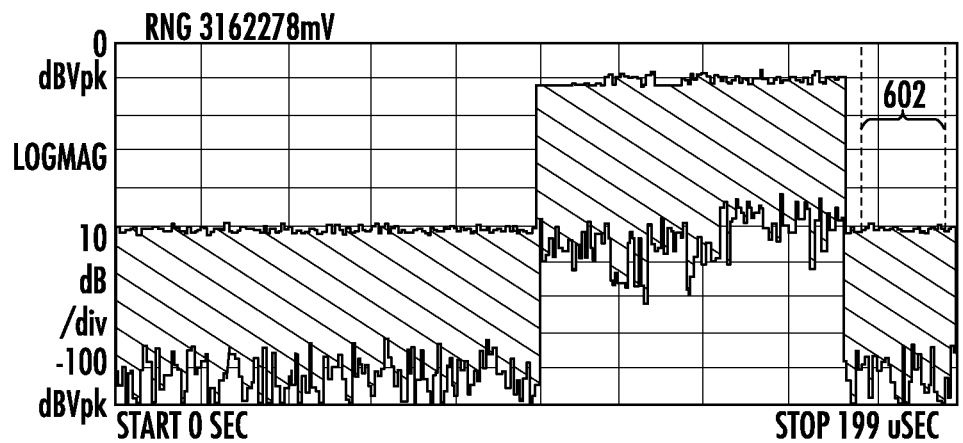
FIG. 6A through FIG. 6F illustrate various profiles of a signal analyzer display at the end of an IQ record where spurious energy levels are being isolated without a signal being present.
Figure 6B:
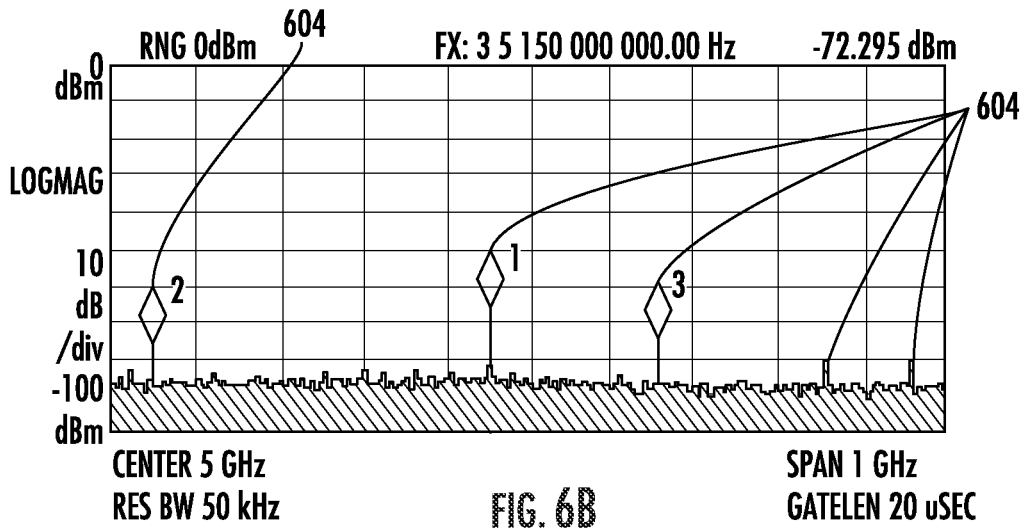
Figure 6C:
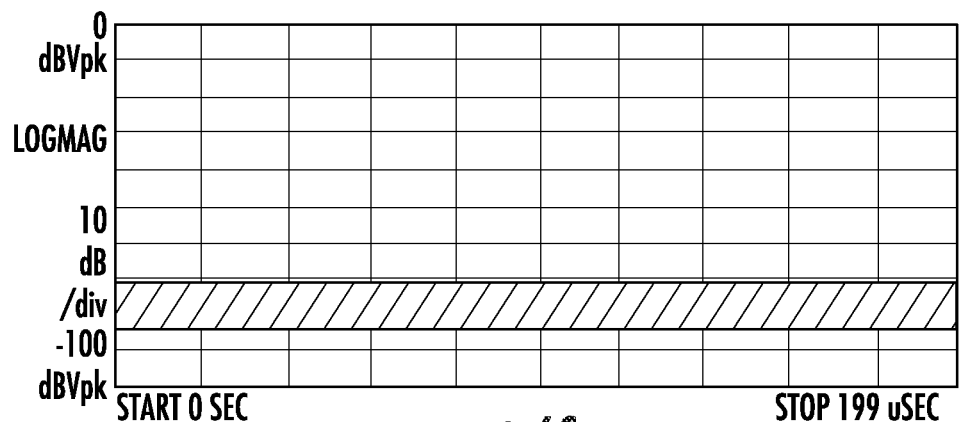
Figure 6D:
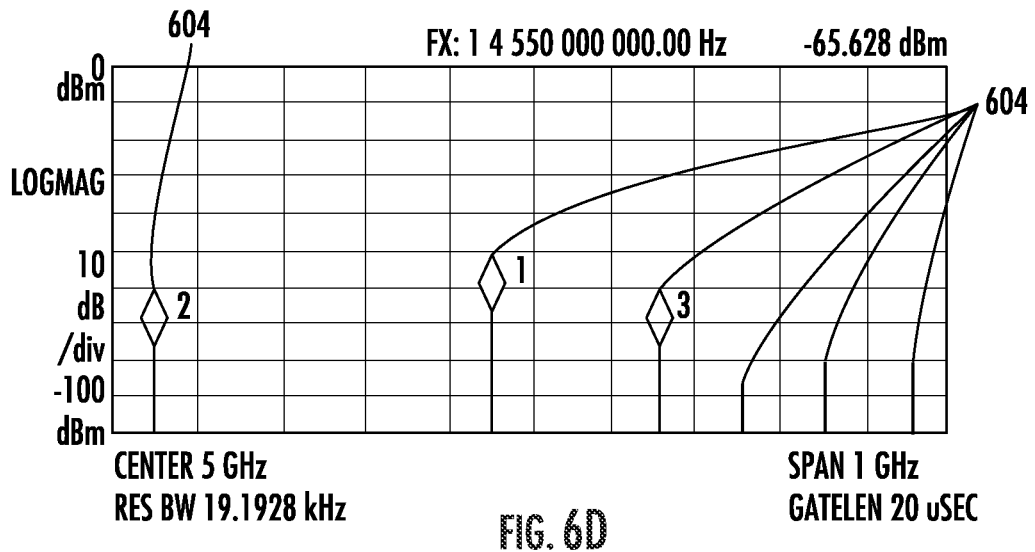
Figure 6E:
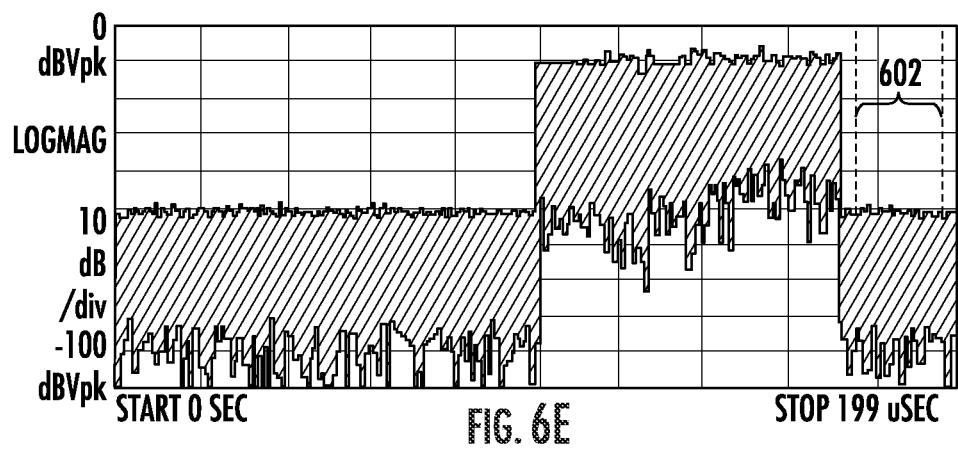
Figure 6F:
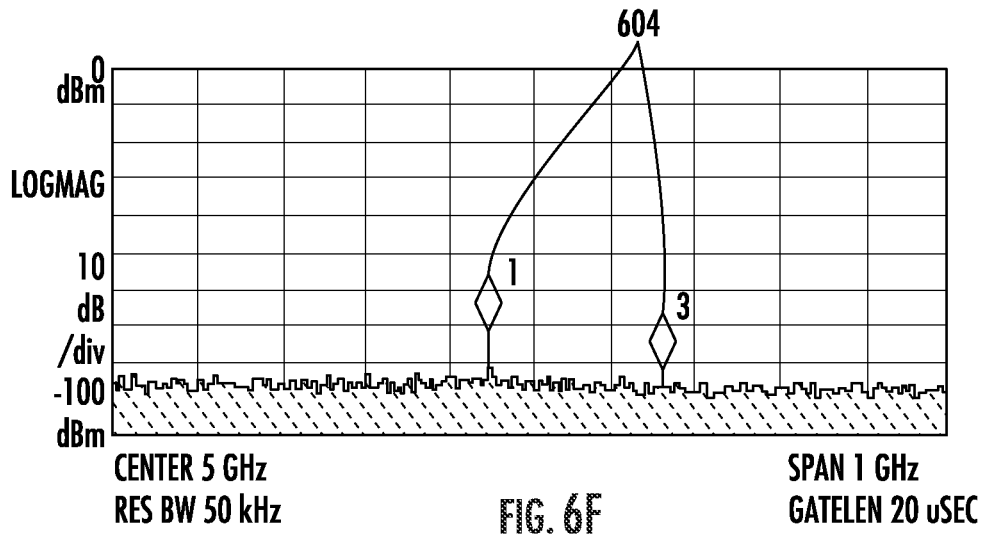

Referring to FIG. 6A through FIG. 6F, which depict the outputs seen on the display as the above described method is implemented and the display focuses on the time period of the IQ data after the input signal has been triggered and then removed. This area is highlighted by the dashed vertical lines in FIG. 6A and will be referred to as the post-signal area 602. As illustrated in FIG. 6B, the frequency-domain spectrum depicts the spurs 604 before the method has been implemented. The method described above is then performed and the spurs are identified and the time-domain spur array is generated in FIG. 6C based on the identified spurs shown in FIG. 6D. After the time-domain spur array is subtracted from the original IQ data from FIG. 6A, the remaining time-domain signal is depicted in FIG. 6E. The frequency-domain spectrum of the time-domain, spur corrected signal of FIG. 6E, is illustrated in FIG. 6F and shows that most, but not all of the spurs 604 were eliminated or substantially reduced. While some spurs 604 still remain, those that do still have a reduced amplitude compared to their pre-correction amplitudes shown in FIG. 6B. Here, six spurs were identified at 5 standard deviations above the mean noise level and the largest three were reduced substantially, or corrected, to the tune of about an 8 dB to about a 30 dB reduction.

Figure 7A:
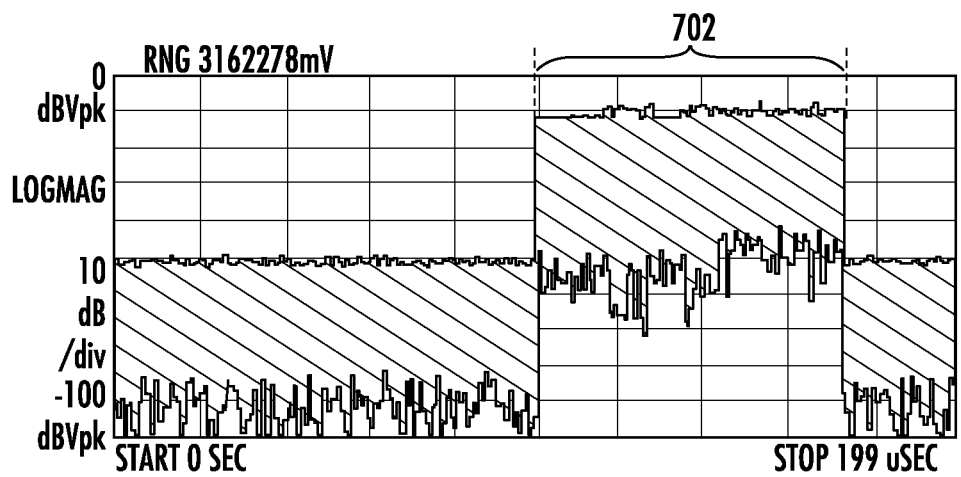
FIG. 7A through FIG. 7F illustrate various profiles of a signal analyzer display at a modulated signal of interest where spurious energy levels are being isolated with a signal being present.
Figure 7B:
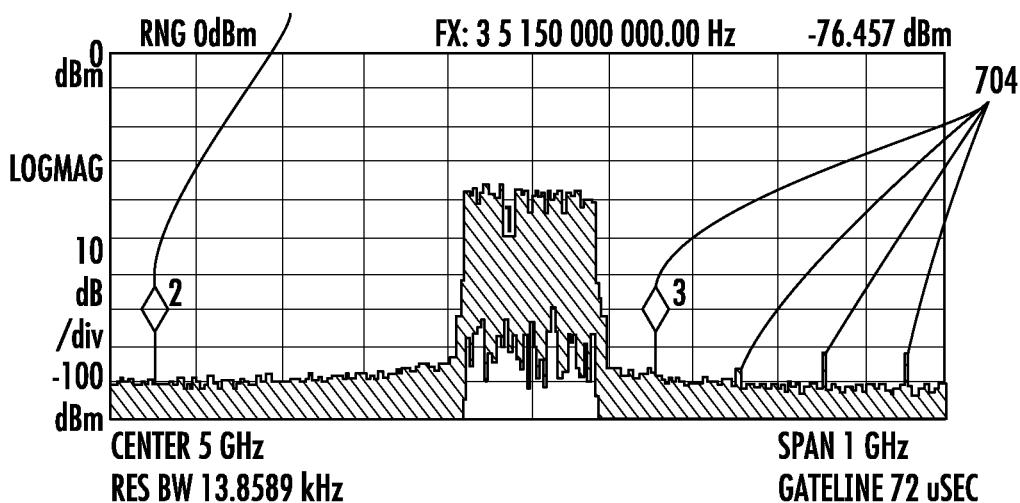
Figure 7C:
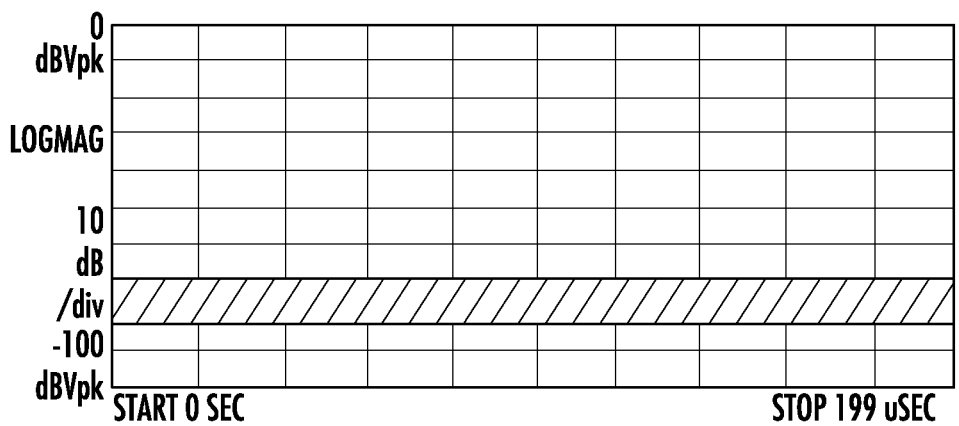
Figure 7D:
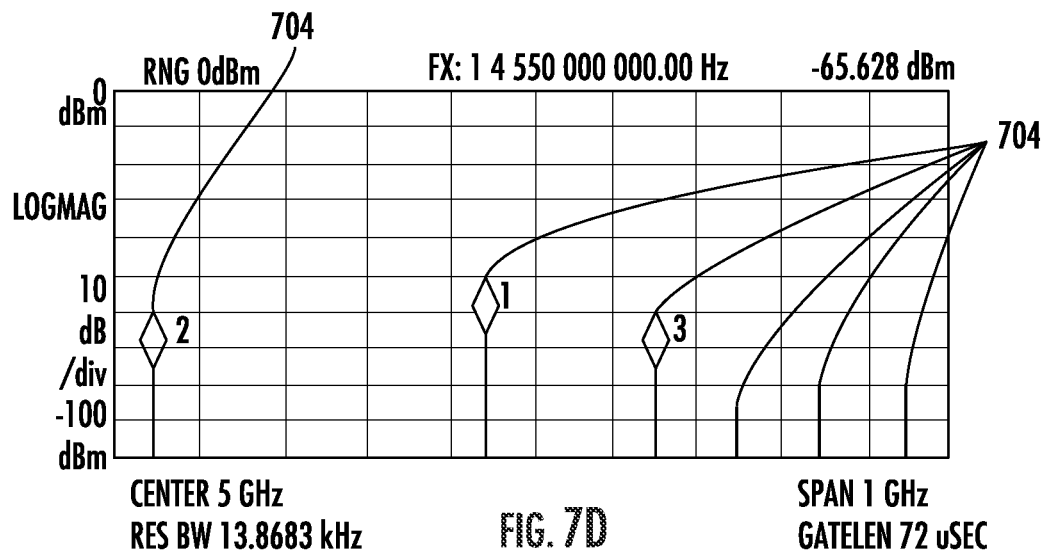
Figure 7E:
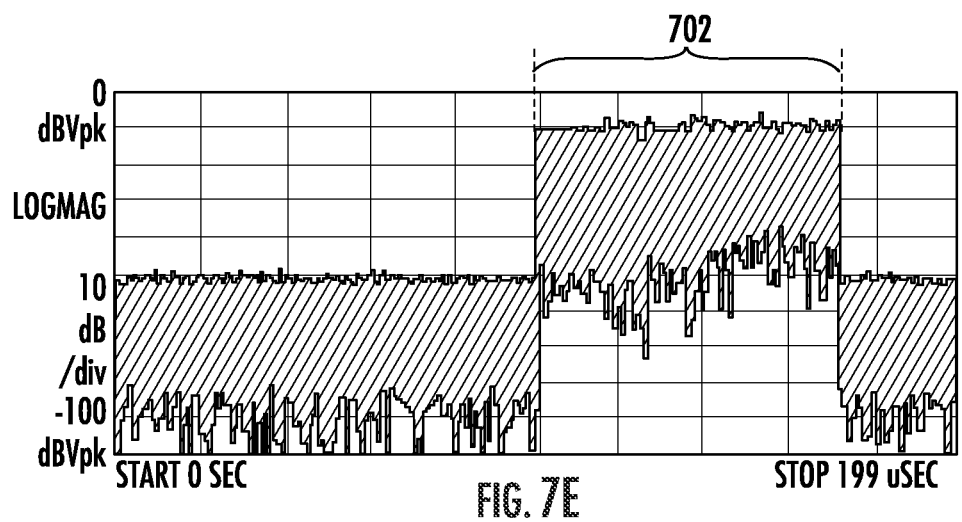
Figure 7F:
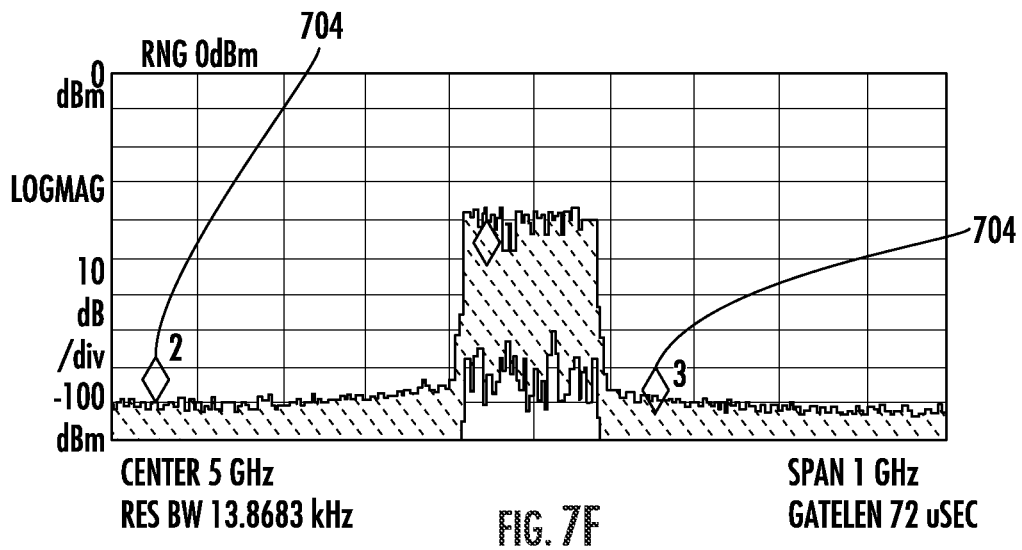

Referring to FIG. 7A through FIG. 7F, which depict the outputs seen on the display as the above method has been implemented. This series of figures illustrates the same outputs above, except the focus period is while the input signal is present. In these figures, the method was still performed before the input signal was displayed, but this depicts how the spurs are removed/reduced even after the input signal is received. As shown in FIG. 7A, the focus area 702 is while the signal input is present and displayed (i.e., between the two vertical dashed lines). FIG. 7B depicts the frequency-domain spectrum of the IQ data of FIG. 7A from the focus area 702. As shown in FIG. 7B, the residual spurs 704 are still present before the method is performed and even with the input signal being received. FIG. 7C and FIG. 7D depict the time-domain and frequency domain spectrum, respectively, of the sparse array representing the spurs. As shown in FIG. 7E and FIG. 7F, the spurs were yet again reduced, or corrected, in this example. Yet again 6 spurs were identified and the measured out-of-band spurs were reduced by about 13-17 dB. The largest spur at 4.96 GHz is within the modulation and the marker reading went up because the spur was deconstructively interfering with the modulation at that frequency. As a result, the corrected measurement at this frequency bin is more accurate as it is not being corrupted by the spur's presence (either up or down). In any event, substantial correction was still achieved with the method of the present disclosure.

Figure 8A:
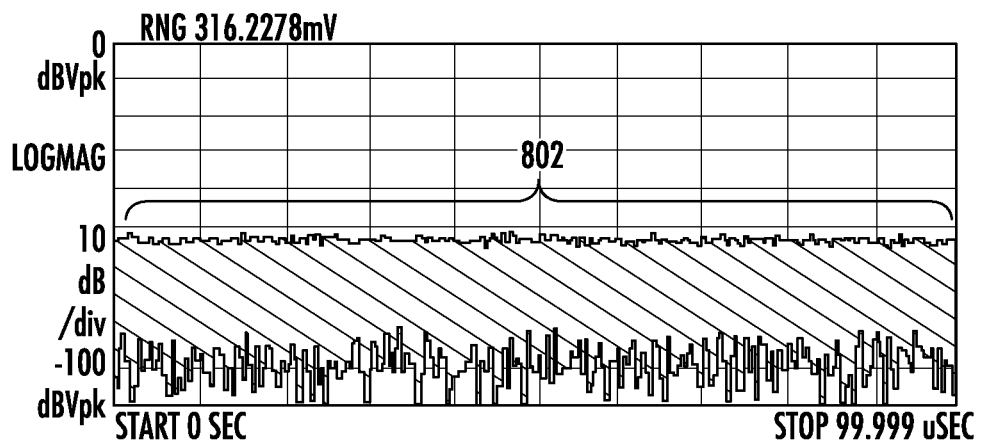
FIG. 8A through FIG. 8F illustrate various profiles of a signal analyzer display taken a time interval after the signal was active, where spurious energy levels are being isolated without a signal being present.
Figure 8B:
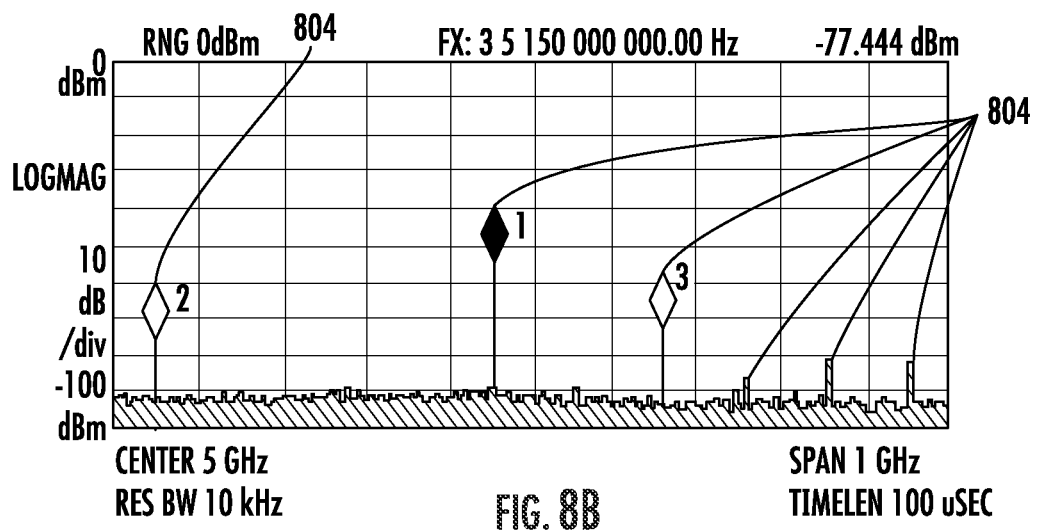
Figure 8C:
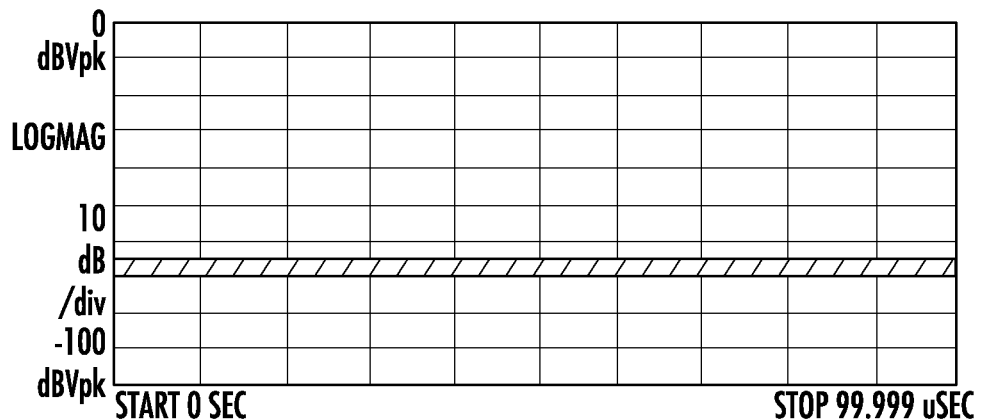
Figure 8D:
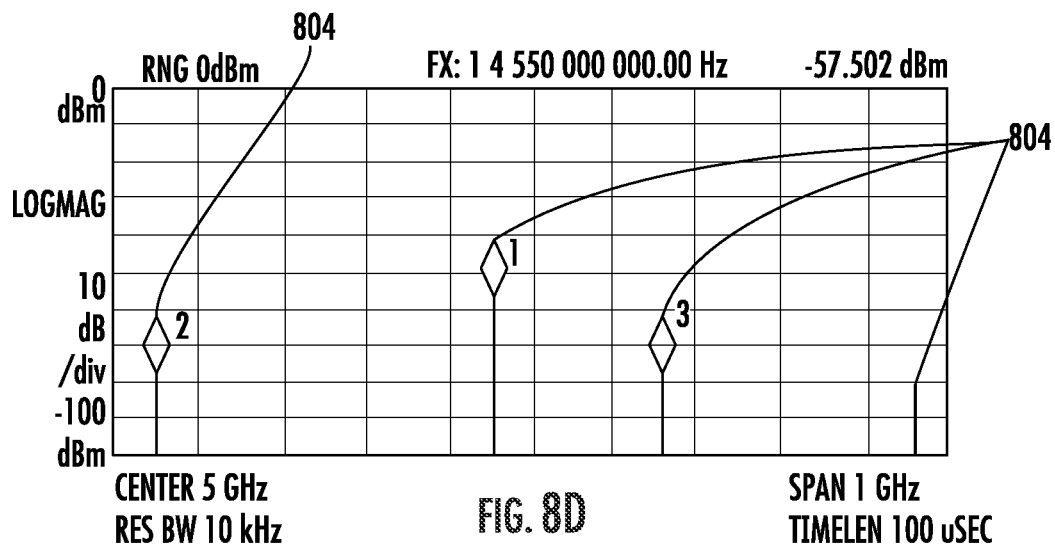
Figure 8E:
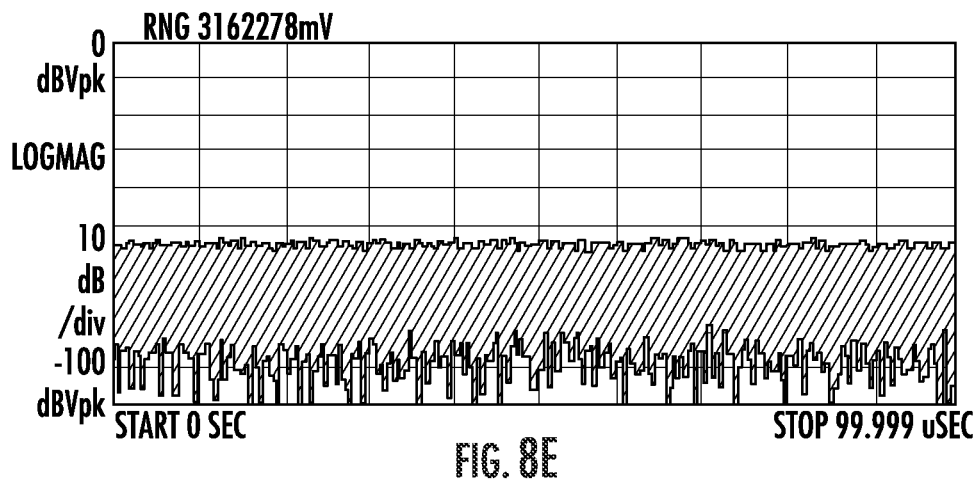
Figure 8F:
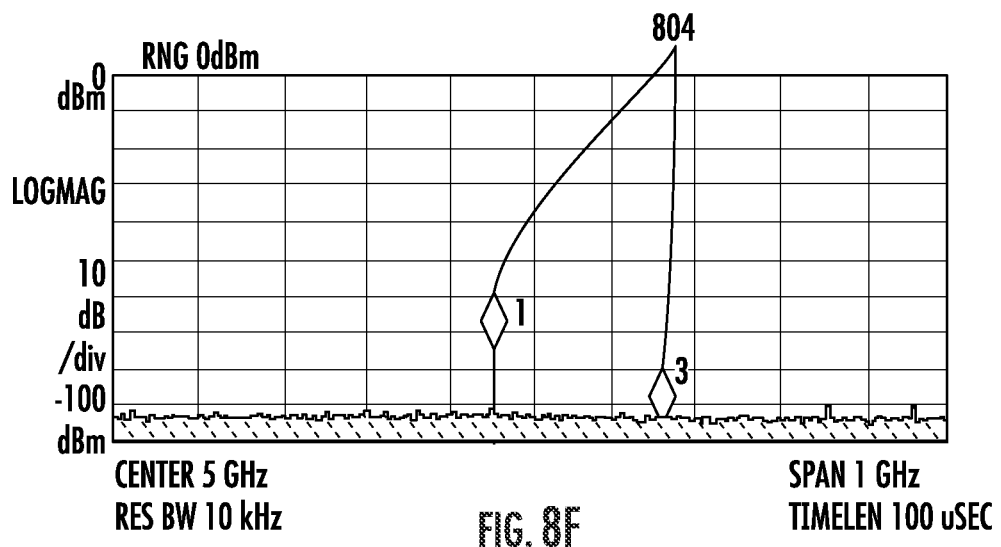

Referring to FIG. 8A through FIG. 8F, which depict the outputs seen on the display of the signal analyzer 10 milliseconds after the input signal is not longer present. Some spurs drift in phase and amplitude quickly so there is only a finite time that the characterization is valid. In FIG. 8A, a 100 microsecond pre-trigger interval 802 is used. The longer interval will give a better estimate of the mean complex value of the spurs. Again FIG. 8B depicts the frequency domain spectrum of the IQ data during the pre-trigger interval 802 and depicts the spurs 804 that are present in the IQ data. FIG. 8C and FIG. 8D depict the time-domain and frequency domain spectrum of the sparse array of the spurs identified using the method of the present disclosure on FIG. 8B. FIG. 8E illustrates the time-domain signal from FIG. 8C subtracted from the time-domain IQ data from FIG. 8A. FIG. 8F depicts the frequency domain spectrum of the corrected IQ data and again, the residual spurs are still substantially decreased to the tun of an 18 dB to 33 dB reduction. This shows that the spurs' amplitude and phase trajectory are stable over this longer period. If they're perfectly stable, perfect spur cancelation is achieved. If they are reasonably stable, reasonable and substantial improvement is achieved. If they drift substantially, same or even worse results than if nothing was done.

Figure 9:
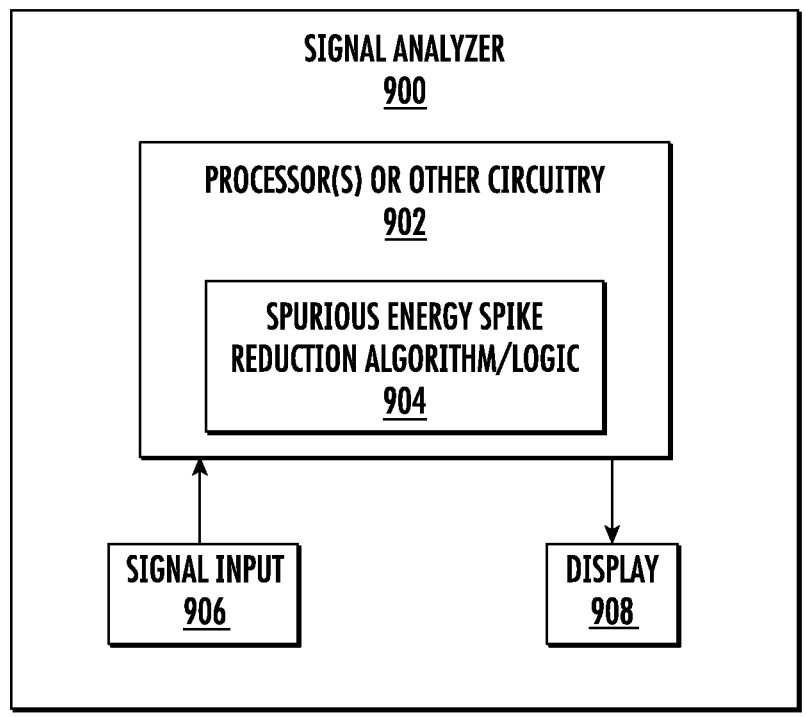
FIG. 9 illustrates a block diagram of an example signal analyzer comprising one or more processors or other circuitry configured to implement residual spur characterization and correction according to some embodiments of the present disclosure.

FIG. 9 illustrates a block diagram depicting major components of a device, namely a signal analyzer 900, according to some embodiments of the present disclosure. In some embodiments, the signal analyzer 900 can comprise, for example and without limitation, a spectrum analyzer, vector-signal analyzer, modulation analyzer, oscilloscope, digitizer, or other receiving device with an ADC and processor(s). In some embodiments, the signal analyzer 900 of the present disclosure comprises one or more processors or other circuitry 902, spurious energy spike reduction and/or elimination algorithms or logic 904, one or more signal input 906, and a display 908. Those having ordinary skill in the art will appreciate that the signal analyzer 900 will comprise other components such as a housing, various electric circuits, power supplies, batteries, etc. to operate the various functions of the signal analyzer 900. However, for the purposes of the present disclosure, the relevant components above will be described.

In some embodiments, the one or more processors or other circuitry 902 can comprise one or more processors, one or more FPGAs, one or more ASICs, one or more integrated circuits, or any other suitable circuitry capable of implementing the methods described herein using the spurious energy spike reduction algorithms/logic 904. In some embodiments, the method is written as one or more pieces of software instructions stored in a computer readable medium and the one or more processors 902 is configured to execute the software instructions. In some embodiments, the methods of the present disclosure are implemented in hardware circuitry such as an ASIC, an FPGA, an integrated circuit, etc. and the hardware circuitry, whatever its form, is configured to implement the methods described herein. In some embodiments, the one or more processors or other circuitry 902 can be configured to operate the method after being triggered to do so by the user (i.e., via a button, switch, knob, or touchscreen actuation), after a given period of time as described herein, and/or upon start-up.

As described herein, it is ideal to implement the spurious energy spike or spur reduction method with the input signal not present. In other words, either the signal input 906 can be disconnected physically, no signal can be present on the connected signal input, or a switch can be included in the signal analyzer 900, wherein the switch is configured to disconnect the signal input from the one or more processors 902 of the signal analyzer 900 and thus, no signal is displayed on the display 908.

In some embodiments, the one or more processors or other circuitry 902 is configured to implement the spurious energy spike reduction/correction methods on the IQ data displayed on the display 908, and then update the display to reflect a signal that has minimized, reduced, or eliminated residual spurs. Although in some cases, the method and systems described herein are used to correct spurs on the display 908, in other embodiments, no display is used at all. The same principles described herein can be used when the display is off and the user retrieves the spectrum or time-domain data programmatically without the analyzer's display enabled. In some other embodiments, the spectrum is measured or calculated, but not necessarily displayed. In other words, prior to the method being implemented, the display 908 shows the spikes in the frequency-domain spectrum of the IQ data. The one or more processors or other circuitry 902 then implement the spur correction methods. Once the methods are implemented and the signal is corrected, the display of the IQ data on the spectrum analyzer 908 is updated to reflect this spur reduction/elimination.

Although FIG. 9 depicts the spurious energy spike reduction algorithm/logic 904 as being located onboard the signal analyzer 900, those having ordinary skill in the art will appreciate that the method of the pending disclosure can be implemented using any processor or suitable circuitry. For example and without limitation, one or more processors or other circuitry external to the signal analyzer 900 (i.e., such as a server, cloud computing devices, personal computers, etc.) can be configured to connect to the signal analyzer 900 and perform the spur reduction methods described herein. Although not depicted in FIG. 9, in some embodiments, an example signal analyzer 900 of the present disclosure comprises a wired or wireless connection (i.e., Wi-Fi, Ethernet, USB, Bluetooth, etc.) to an external processor configured to perform the methods described herein. In some other embodiments, the processor or other circuitry configured to perform the methods described herein can be installed into the signal analyzer 900 as an after-market upgrade or added feature. Furthermore, in some embodiments of the present disclosure, a central processing unit (CPU) of the signal analyzer 900 (i.e., the main processor of the signal analyzer 900) can be configured to implement the methods of the present subject matter or a dedicated processor or other circuitry can be provided to or installed on the signal analyzer 900 (i.e., such as an aftermarket device) to perform the methods of the present subject matter.

The foregoing description illustrates methods, devices, and systems designed to improve computer related technology. Here, the improvement is to the spurious energy spikes caused by internal components in the signal analyzer. It improves the signal analyzer technology, clearly a computer related technology, by implementing the spurious energy spike reduction methods to make the display of the IQ data more accurate. Without these improvements, the spectrum analyzer produces frequency-domain spectrums that might not accurately reflect the signal being received.

The present subject matter can be embodied in other forms without departure from the spirit and essential characteristics thereof. The embodiments described therefore are to be considered in all respects as illustrative and not restrictive. Although the present subject matter has been described in terms of certain specific embodiments, other embodiments that are apparent to those of ordinary skill in the art are also within the scope of the present subject matter.

What is claimed is:

1. A method for reducing or removing spurious energy spikes on a display of a signal analyzer, the method being implemented by one or more processors or other circuitry of the signal analyzer, the method comprising:
    displaying a signal on the display of the signal analyzer that is present without an input signal being provided to an input of the signal analyzer;
    establishing a predetermined amplitude threshold above which energy spikes in the signal being displayed on the display of the signal analyzer are considered spurious;
    automatically identifying one or more spurious energy spikes in the signal being displayed on the display of the signal analyzer based on the predetermined amplitude threshold; and
    automatically reducing or removing the one or more spurious energy spikes from the signal being displayed on the display of the signal analyzer.

2. The method of claim 1, wherein establishing the predetermined amplitude threshold comprises:
    automatically determining a standard deviation of energy levels in the signal being displayed on the display of the signal analyzer without the input signal being provided to the input of the signal analyzer; and
    automatically setting the predetermined amplitude threshold to be N of the standard deviation above a root mean square (RMS) value of the energy levels displayed, N being a non-negative number.

3. The method of claim 1, wherein automatically identifying one or more spurious energy spikes includes classifying portions of a frequency domain representation of the signal being displayed on the display into frequency bins and identifying frequency bins corresponding to portions of the frequency domain representation of the signal having amplitudes above the predetermined amplitude threshold as spurious energy spikes.

4. The method of claim 1, wherein automatically reducing or removing the one or more spurious energy spikes comprises:
    automatically creating a sparse array storing values representing a frequency spectrum of the one or more spurious energy spikes;
    automatically performing an inverse fast Fourier transform (IFFT) of the values stored in the sparse array to obtain a time-domain array having values representing the one or more spurious energy spikes;
    automatically subtracting values in the time-domain array representing the one or more spurious energy spikes from a summation of values representing the spurious energy spikes displayed on the display of the signal analyzer and values representing the input signal to be measured; and automatically updating display of the signal being displayed by the display of the signal analyzer to reflect the reduced or removed spurious energy spikes.

5. The method of claim 4, wherein creating the sparse array comprises extrapolating the spectrum beyond a pre-signal interval.

6. The method of claim 5, wherein the pre-signal interval is an interval on the display of the signal analyzer where an input signal is not received by the signal analyzer.

7. The method of claim 1, wherein the method is automatically performed after powering on the signal analyzer; or wherein the method is automatically performed after a predetermined time period; or wherein the method is performed after a user of the signal analyzer initiates the method by pressing a button, turning a knob, or other triggering mechanism.

8. A device for reducing or removing spurious energy spikes on a display of a signal analyzer, the device comprising:

one or more processors or other circuitry configured to:
display a signal on the display of the signal analyzer that is present without an input signal being provided to an input of the signal analyzer;
establish a predetermined amplitude threshold above which energy spikes in the signal being displayed on the display of the signal analyzer are considered spurious;
automatically identify one or more spurious energy spikes in the signal being displayed on the display of the signal analyzer based on the predetermined amplitude threshold; and
automatically reduce or remove the one or more spurious energy spikes from the signal being displayed on the display of the signal analyzer.

9. The device of claim 8, wherein, in order to establish the predetermined amplitude threshold, the one or more processors or other circuitry is further configured to:
automatically determine a standard deviation of energy levels in the signal being displayed on the display of the signal analyzer without the input signal being provided to the input of the signal analyzer; and
automatically set the predetermined amplitude threshold to be N of the standard deviation above a root mean square (RMS) value of the energy levels displayed, N being a non-negative number.

10. The device of claim 8, wherein the one or more processors or other circuitry are configured to classify portions of a frequency domain representation of the signal being displayed on the display into frequency bins and frequency bins corresponding to portions of the frequency domain representation of the signal having amplitudes above the predetermined amplitude threshold are identified as spurious energy spikes.

11. The device of claim 8, wherein in order to automatically reduce or remove the one or more spurious energy spikes, the one or more processors or other circuitry is configured to:
automatically create a sparse array storing values representing a frequency spectrum of the one or more spurious energy spikes;
automatically perform an inverse fast Fourier transform (IFFT) of the values stored in the sparse array to obtain a time-domain array having values representing the one or more spurious energy spikes;
automatically subtract values in the time-domain array representing the one or more spurious energy spikes from a summation of values representing the spurious energy spikes displayed on the display of the signal analyzer plus values representing the input signal to be measured; and
automatically update display of the signal being displayed by the display of the signal analyzer to reflect the reduced or removed spurious energy spikes.

12. The device of claim 11, wherein the one or more processors or other circuitry is configured to create the sparse array by extrapolating the spectrum beyond a pre-signal interval.

13. The device of claim 12, wherein the pre-signal interval is an interval on the display of the signal analyzer where an input signal is not received by the signal analyzer.

14. The device of claim 8, wherein the one or more processors or other circuitry is configured to automatically reduce or remove the one or more spurious energy spikes from the signal being displayed on the display of the signal analyzer after powering on the signal analyzer;

wherein the one or more processors or other circuitry is configured to automatically reduce or remove the one or more spurious energy spikes from the signal being displayed on the display of the signal analyzer after a predetermined time period; or wherein the one or more processors or other circuitry is configured to automatically reduce or remove the one or more spurious energy spikes from the signal being displayed on the display of the signal analyzer after a user of the signal analyzer initiates the method by pressing a button, turning a knob, or other triggering mechanism.

15. A signal analyzer comprising:
a display configured for displaying a signal that is present without an input signal being provided to an input of the signal analyzer; and
one or more processors or other circuitry for removing or reducing spurious energy spikes on the display of the signal analyzer, the one or more processors or other circuitry being configured to:
establish a predetermined amplitude threshold above which energy spikes in the signal being displayed on the display of the signal analyzer are considered spurious;
automatically identify one or more spurious energy spikes in the signal being displayed on the display of the signal analyzer based on the predetermined amplitude threshold; and
automatically reduce or remove the one or more spurious energy spikes from the signal being displayed on the display of the signal analyzer.

16. The signal analyzer of claim 15, wherein, in order to establish the predetermined amplitude threshold, the one or more processors or other circuitry is further configured to:
automatically determine a standard deviation of energy levels in the signal being displayed on the display of the signal analyzer without the input signal being provided to the input of the signal analyzer; and
automatically set the predetermined amplitude threshold to be N of the standard deviation above a root mean square (RMS) value of the energy levels displayed, N being a non-negative number.

17. The signal analyzer of claim 15, wherein the one or more processors or other circuitry are configured to classify portions of a frequency domain representation of the signal being displayed on the display into frequency bins and frequency bins corresponding to portions of the frequency domain representation of the signal having amplitudes above the predetermined amplitude threshold are identified as spurious energy spikes.

18. The signal analyzer of claim 15, wherein in order to automatically reduce or remove the one or more spurious energy spikes, the one or more processors or other circuitry is configured to:
- automatically create a sparse array storing values representing a frequency spectrum of the one or more spurious energy spikes;
- automatically perform an inverse fast Fourier transform (IFFT) of the values stored in the sparse array to obtain a time-domain array having values representing the one or more spurious energy spikes;
- automatically subtract values in the time-domain array representing the one or more spurious energy spikes from a summation of values representing the spurious energy spikes displayed on the display of the signal analyzer plus values representing the input signal to be measured; and
- automatically update display of the signal being displayed by the display of the signal analyzer to reflect the reduced or removed spurious energy spikes.

19. The signal analyzer of claim 18, wherein the one or more processors or other circuitry is configured to create the sparse array by extrapolating the spectrum beyond a pre-signal interval; and
- wherein the pre-signal interval is an interval on the display of the signal analyzer where an input signal is not received by the signal analyzer.

20. The signal analyzer of claim 15, wherein the one or more processors or other circuitry is configured to automatically reduce or remove the one or more spurious energy spikes from the signal being displayed on the display of the signal analyzer after powering on the signal analyzer;
- wherein the one or more processors or other circuitry is configured to automatically reduce or remove the one or more spurious energy spikes from the signal being displayed on the display of the signal analyzer after a predetermined time period; or
- wherein the one or more processors or other circuitry is configured to automatically reduce or remove the one or more spurious energy spikes from the signal being displayed on the display of the signal analyzer after a user of the signal analyzer initiates the method by pressing a button, turning a knob, or other triggering mechanism.

* * * * *